United States Patent
Lee et al.

(10) Patent No.: US 12,035,575 B2
(45) Date of Patent: Jul. 9, 2024

(54) HIGH RESOLUTION ADVANCED OLED SUB-PIXEL CIRCUIT AND PATTERNING METHOD

(71) Applicant: Applied Materials, Inc., Santa Clara, CA (US)

(72) Inventors: Jungmin Lee, Santa Clara, CA (US); Chung-chia Chen, Hsinchu (TW); Ji Young Choung, Hwaseong-si (KR); Yu-hsin Lin, Zhubei (TW)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/545,709

(22) Filed: Dec. 19, 2023

(65) Prior Publication Data

US 2024/0121995 A1  Apr. 11, 2024

Related U.S. Application Data

(63) Continuation of application No. 18/528,906, filed on Dec. 5, 2023, which is a continuation of application
(Continued)

(51) Int. Cl.
  *H10K 59/122*   (2023.01)
  *H10K 59/12*   (2023.01)
  *H10K 59/80*   (2023.01)

(52) U.S. Cl.
  CPC ....... *H10K 59/122* (2023.02); *H10K 59/1201* (2023.02); *H10K 59/80521* (2023.02)

(58) Field of Classification Search
  None
  See application file for complete search history.

(56) References Cited

U.S. PATENT DOCUMENTS

| 6,060,728 A | 5/2000 | Ghosh et al. |
| 6,137,220 A | 10/2000 | Nagayama et al. |

(Continued)

FOREIGN PATENT DOCUMENTS

| CN | 105742311 A | 7/2016 |
| JP | 4975064 B2 | 7/2012 |

(Continued)

OTHER PUBLICATIONS

International Search Report/Written Opinion issued to PCT/US2021/021077 on Jun. 23, 2021.
(Continued)

*Primary Examiner* — Nduka E Ojeh
(74) *Attorney, Agent, or Firm* — Patterson + Sheridan, LLP

(57) ABSTRACT

Embodiments described herein relate to a sub-pixel. The sub-pixel includes an anode, overhang structures, separation structures, an organic light emitting diode (OLED) material, and a cathode. The anode is defined by adjacent first pixel isolation structures (PIS) and adjacent second PIS. The overhang structures are disposed on the first PIS. The overhang structures include a second structure disposed over the first structure and an intermediate structure disposed between the second structure and the first structure. A bottom surface of the second structure extends laterally past an upper surface of the first structure. The first structure is disposed over the first PIS. Separation structures are disposed over the second PIS. The OLED material is disposed over the anode and an upper surface of the separation structures. The cathode disposed over the OLED material and an upper surface of the separation structures.

18 Claims, 27 Drawing Sheets

Related U.S. Application Data

No. 18/315,362, filed on May 10, 2023, now Pat. No. 11,882,709.

(60) Provisional application No. 63/484,608, filed on Feb. 13, 2023, provisional application No. 63/433,209, filed on Dec. 16, 2022, provisional application No. 63/364,597, filed on May 12, 2022.

(56) References Cited

U.S. PATENT DOCUMENTS

| | | |
|---|---|---|
| 6,476,988 B1 | 11/2002 | Yudasaka |
| 8,686,629 B2 | 4/2014 | Oh et al. |
| 8,987,717 B2 | 3/2015 | Kang |
| 9,324,962 B2 | 4/2016 | Kim |
| 9,337,244 B2 | 5/2016 | Hatano et al. |
| 10,170,526 B1 | 1/2019 | Yang |
| 10,580,843 B2 | 3/2020 | Zhao et al. |
| 10,615,231 B2 | 4/2020 | Wu et al. |
| 2002/0014836 A1 | 2/2002 | Codama et al. |
| 2003/0006697 A1 | 1/2003 | Weaver |
| 2006/0170340 A1 | 8/2006 | Tzen et al. |
| 2008/0231168 A1* | 9/2008 | Choi ............... H10K 59/122 313/500 |
| 2009/0009069 A1 | 1/2009 | Takata |
| 2012/0217516 A1 | 8/2012 | Hatano et al. |
| 2012/0228603 A1* | 9/2012 | Nakamura ........... H10K 50/828 257/40 |
| 2014/0103385 A1 | 4/2014 | Hatano et al. |
| 2014/0131743 A1 | 5/2014 | Jiang et al. |
| 2015/0060809 A1 | 3/2015 | Kim et al. |
| 2015/0162563 A1 | 6/2015 | Ide et al. |
| 2019/0058020 A1 | 2/2019 | Tsai et al. |
| 2019/0088730 A1 | 3/2019 | Lee et al. |
| 2019/0348482 A1 | 11/2019 | Bae et al. |
| 2020/0119114 A1 | 4/2020 | Kim et al. |
| 2021/0135150 A1 | 5/2021 | Wang et al. |
| 2021/0397302 A1 | 12/2021 | Yang et al. |
| 2022/0077251 A1 | 3/2022 | Choung et al. |

FOREIGN PATENT DOCUMENTS

| | | |
|---|---|---|
| JP | 2016225319 A | 12/2016 |
| KR | 2001-0103000 A | 11/2001 |
| KR | 100612118 B1 | 8/2006 |
| KR | 20140085979 A | 7/2014 |
| KR | 20150025902 A | 3/2015 |
| KR | 20150042989 A | 11/2015 |
| KR | 20170003298 A | 1/2017 |

OTHER PUBLICATIONS

International Search Report/Written Opinion issued to PCT/US2021/021097 on Jul. 1, 2021.
PCT/US2023/011865, International Search Report and Written Opinion dated Jun. 13, 2023, 13 pages.
PCT/US2023/021698, International Search Report and Written Opinion dated Aug. 31, 2023, 11 pages.
Korean Notice of Sumission of Third Party Oberservation issued to Patent Application No. 10-2023-7011144 on Nov. 12, 2023.
EP Third Party Observation for application No. EP20210864841.

* cited by examiner

HIGH RESOLUTION ADVANCED OLED SUB-PIXEL CIRCUIT AND PATTERNING METHOD

CROSS-REFERENCE TO RELATED APPLICATIONS

This application is a continuation of U.S. patent application Ser. No. 18/528,906, filed Dec. 5, 2023, which is a continuation of U.S. patent application Ser. No. 18/315,362, filed on May 10, 2023 which claims priority to U.S. Provisional Patent Application Ser. No. 63/364,597, filed on May 12, 2022, 63/433,209, filed on Dec. 16, 2022, and 63/484,608, filed on Feb. 13, 2023, which are herein incorporated by reference.

BACKGROUND

Field

Embodiments described herein generally relate to a display. More specifically, embodiments described herein relate to sub-pixel circuits and methods of forming sub-pixel circuits that may be utilized in a display such as an organic light-emitting diode (OLED) display.

Description of the Related Art

Input devices including display devices may be used in a variety of electronic systems. An organic light-emitting diode (OLED) is a light-emitting diode (LED) in which the emissive electroluminescent layer is a film of an organic compound that emits light in response to an electric current. OLED devices are classified as bottom emission devices if light emitted passes through the transparent or semi-transparent bottom electrode and substrate on which the panel was manufactured. Top emission devices are classified based on whether or not the light emitted from the OLED device exits through the lid that is added following the fabrication of the device. OLEDs are used to create display devices in many electronics today. Today's electronics manufacturers are pushing these display devices to shrink in size while providing higher resolution than just a few years ago.

OLED pixel patterning is currently based on a process that restricts panel size, pixel resolution, and substrate size. Rather than utilizing a fine metal mask, photo lithography should be used to pattern pixels. Currently, OLED pixel patterning requires lifting off organic material after the patterning process. When lifted off, the organic material leaves behind a particle issue that disrupts OLED performance. Accordingly, what is needed in the art are sub-pixel circuits and methods of forming sub-pixel circuits to increase pixel-per-inch and provide improved OLED performance.

SUMMARY

In one embodiment, a sub-pixel is provided. The sub-pixel includes an anode, overhang structures, an organic light emitting diode (OLED) material, and a cathode. The anode is defined by adjacent first pixel isolation structures (PIS) and adjacent second PIS. The overhang structures are disposed on the first PIS. The overhang structures include a second structure disposed over the first structure and an intermediate structure disposed between the second structure and the first structure. A bottom surface of the second structure extends laterally past an upper surface of the first structure. The first structure is disposed over the first PIS. Separation structures are disposed over the second PIS. The OLED material is disposed over the anode and an upper surface of the separation structures. The cathode disposed over the OLED material and an upper surface of the separation structures.

In another embodiment, a device is disclosed. The device includes a plurality of sub-pixel lines. Each sub-pixel line includes at least a first sub-pixel and a second sub-pixel. The first sub-pixel and the second sub-pixel each include an anode, overhang structures, separation structures, an organic light emitting diode (OLED) material, and a cathode. The anode is defined by adjacent first pixel isolation structures (PIS) and adjacent second PIS. The overhang structures are disposed on the first PIS. The overhang structures include a second structure disposed over the first structure and an intermediate structure disposed between the second structure and the first structure. A bottom surface of the second structure extends laterally past an upper surface of the first structure. The first structure is disposed over the first PIS. The separation structures are disposed over the second PIS. One of the separation structures separates the first pixel and the second pixel. The OLED material is disposed over the anode and an upper surface of the separation structures. The OLED material of the first subpixel and the second subpixel emit a first color. The cathode is disposed over the OLED material and an upper surface of the separation structures.

In another embodiment, a method of forming a device is disclosed. The method includes depositing an anode and a PIS layer over a substrate, removing portions of the PIS layer to form a first PIS and a second PIS, depositing a first structure layer, an intermediate layer and a second structure layer over the substrate, depositing and patterning a first resist over the second structure layer, removing a portion of the second structure layer and the intermediate layer to form a second structure and intermediate structure using ion beam milling, removing the first resist from the second structure, depositing and patterning a second resist over the first structure layer, dry etching and removing a portion of the first structure layer to form a first structure, depositing an organic light emitting diode (OLED) material, a cathode, and an encapsulation layer, depositing and patterning a third resist in a first sub-pixel, ashing and removing a portion of the OLED material, the cathode, and the encapsulation layer, and removing the third resist. The second structure layer is deposited by sputter deposition.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1A:
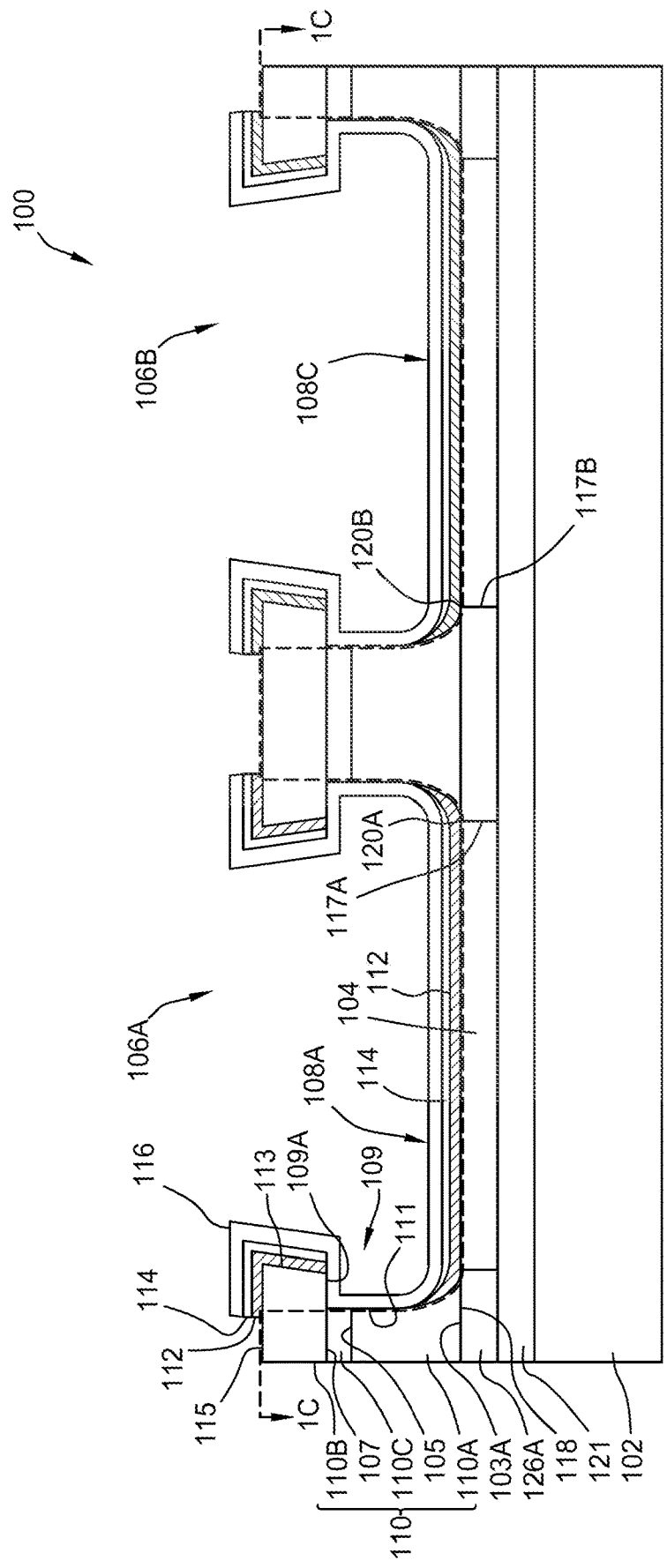
FIG. 1A is a schematic, cross-sectional view of a sub-pixel circuit at section line 1A-1A according to embodiments.

Embodiments described herein generally relate to a display. More specifically, embodiments described herein relate to sub-pixel circuits and methods of forming sub-pixel circuits that may be utilized in a display such as an organic light-emitting diode (OLED) display. In various embodiments, the sub-pixels employ advanced overhang structures to improve functionality of the display.

In one embodiment, a sub-pixel is provided. The sub-pixel includes an anode, overhang structures, separation structures, an organic light emitting diode (OLED) material, and a cathode. The anode is defined by adjacent first pixel isolation structures (PIS) and adjacent second PIS. The overhang structures are disposed on the first PIS. The overhang structures include a second structure disposed over the first structure and an intermediate structure disposed between the second structure and the first structure. A bottom surface of the second structure extends laterally past an upper surface of the first structure. The first structure is disposed over the first PIS. The separation structures are disposed over the second PIS. The OLED material is disposed over the anode and an upper surface of the separation structures. The cathode disposed over the OLED material and an upper surface of the separation structures.

In one embodiment, a device is disclosed. The device includes a plurality of sub-pixel lines. Each sub-pixel line includes at least a first sub-pixel and a second sub-pixel. The first sub-pixel and the second sub-pixel each include an anode, overhang structures, separation structures, an organic light emitting diode (OLED) material, and a cathode. The anode is defined by adjacent first pixel isolation structures (PIS) and adjacent second PIS. The overhang structures are disposed on the first PIS. The overhang structures include a second structure disposed over the first structure and an intermediate structure disposed between the second structure and the first structure. A bottom surface of the second structure extends laterally past an upper surface of the first structure. The first structure is disposed over the first PIS. The separation structures are disposed over the second PIS. One of the separation structures separates the first pixel and the second pixel. The OLED material is disposed over the anode and an upper surface of the separation structures. The OLED material of the first subpixel and the second subpixel emit a first color. The cathode is disposed over the OLED material and an upper surface of the separation structures.

In another embodiment, a method of forming a device is disclosed. The method includes depositing an anode and a PIS layer over a substrate, removing portions of the PIS layer to form a first PIS and a second PIS, depositing a first structure layer, an intermediate layer and a second structure layer over the substrate, depositing and patterning a first resist over the second structure layer, removing a portion of the second structure layer and the intermediate layer to form a second structure and intermediate structure using ion beam milling, removing the first resist from the second structure, depositing and patterning a second resist over the first structure layer, dry etching and removing a portion of the first structure layer to form a first structure, depositing an organic light emitting diode (OLED) material, a cathode, and an encapsulation layer, depositing and patterning a third resist in a first sub-pixel, ashing and removing a portion of the OLED material, the cathode, and the encapsulation layer, and removing the third resist. The second structure layer is deposited by sputter deposition.

Each of the embodiments described herein of the sub-pixel circuit include a plurality of sub-pixels with each of the sub-pixels are defined by adjacent overhang structures that are permanent to the sub-pixel circuit. While the Figures depict two sub-pixels with each sub-pixel defined by adjacent overhang structures, the sub-pixel circuit of the embodiments described herein include a plurality of sub-pixels, such as two or more subpixels. Each sub-pixel has OLED materials configured to emit a white, red, green, blue or other color light when energized. E.g., the OLED materials of a first sub-pixel emits a red light when energized, the OLED materials of a second sub-pixel emits a green light when energized, and the OLED materials of a third sub-pixel emits a blue light when energized.

The overhangs are permanent to the sub-pixel circuit and include at least a second structure disposed over a first structure. The adjacent overhang structures defining each sub-pixel of the sub-pixel circuit of the display provide for formation of the sub-pixel circuit using evaporation deposition and provide for the overhang structures to remain in place after the sub-pixel circuit is formed. Evaporation deposition is utilized for deposition of OLED materials (including a hole injection layer (HIL), a hole transport layer (HTL), an emissive layer (EML), and an electron transport layer (ETL)) and cathode. In some instances, an encapsulation layer may be disposed via evaporation deposition. In embodiments including one or more capping layers, the capping layers are disposed between the cathode and the encapsulation layer. The overhang structures and the evaporation angle set by the evaporation source define the deposition angles, i.e., the overhang structures provide for a shadowing effect during evaporation deposition with the evaporation angle set by the evaporation source. In order to deposit at a particular angle, the evaporation source is configured to emit the deposition material at a particular angle with regard to the overhang structure. The encapsulation layer of a respective subpixel is disposed over the cathode with the encapsulation layer extending under at least a portion of each of the adjacent overhang structures and along a sidewall of each of the adjacent overhang structures.

Figure 1B:
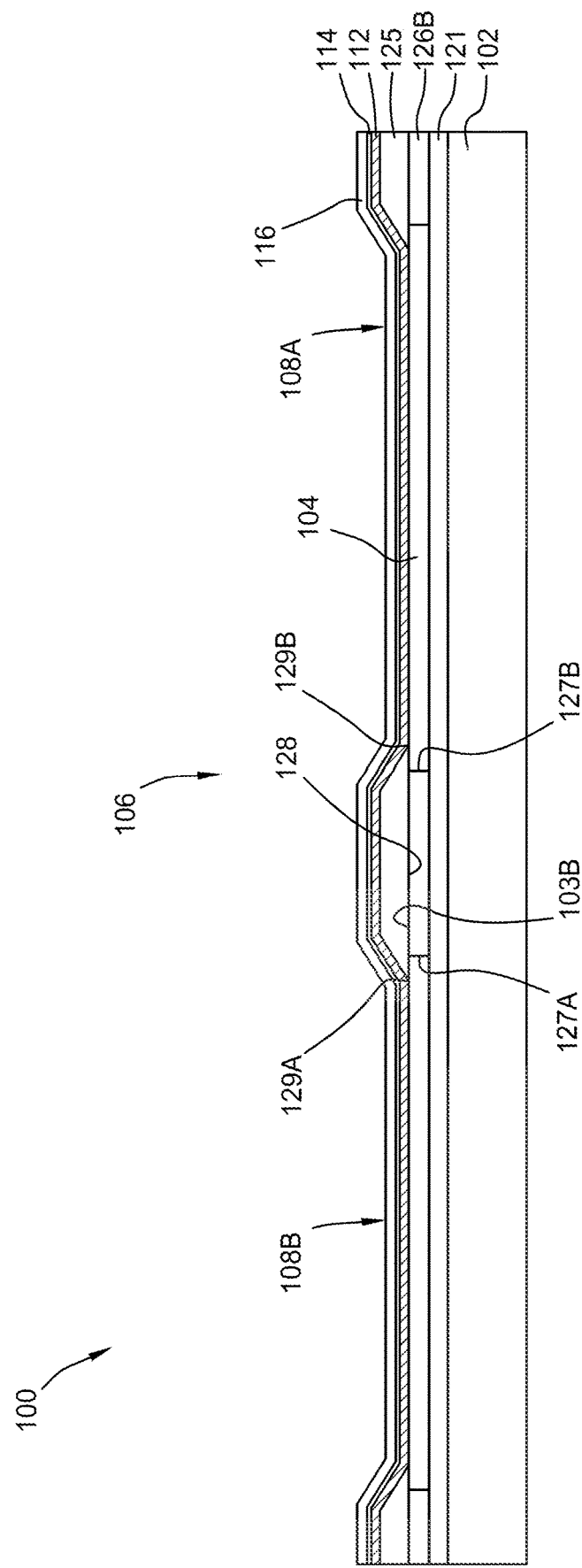
FIG. 1B is a schematic, cross-sectional view of a sub-pixel circuit at section line 1B-1B according to embodiments.

FIG. 1A is a schematic, cross-sectional view of a sub-pixel circuit 100 according to embodiments. The cross-sectional view of FIG. 1A is taken along section line 1A-1A of FIG. 1C (e.g., a pixel plane). FIG. 1B is a schematic, cross-sectional view of a sub-pixel circuit 100 according to embodiments. The cross-sectional view of FIG. 1B is taken along section line 1B-1B of FIG. 1C (e.g., a line plane). The sub-pixel circuit 100 includes a substrate 102. A base layer 121 may be patterned over the substrate 102. The base layer 121 includes, but is not limited to, a CMOS layer. Metal-containing layers (e.g., anodes 104) may be patterned on the base layer 121 and are defined by adjacent first pixel isolation structures (PIS) 126A and second PIS 126B disposed on the substrate 102. In one embodiment, the anodes 104 are pre-patterned on the base layer 121. E.g., the base layer 121 is pre-patterned with anodes 104 of indium tin oxide (ITO). The anodes 104 may be disposed on the substrate 102. The anodes 104 are configured to operate as anodes of respective sub-pixels. In one embodiment, the anode 104 is a layer stack of a first transparent conductive oxide (TCO) layer, a second metal-containing layer disposed on the first TCO layer, and a third TCO layer disposed on the second metal-containing layer. The anodes 104 include, but are not limited to, chromium, titanium, gold, silver, copper, aluminum, ITO, a combination thereof, or other suitably conductive materials.

The first PIS 126A and second PIS 126B are disposed over the substrate 102. The first PIS 126A and second PIS 126B may be disposed on the base layer 121. The first PIS 126A is disposed along the line plane. The line plane extends along a first direction. The second PIS 126B is disposed along the pixel plane. The pixel plane extends along a second direction. The first direction is perpendicular to the second direction. The first PIS 126A and second PIS 126B include one of an organic material, an organic material with an inorganic coating disposed thereover, or an inorganic material. The organic material of the first PIS 126A and second PIS 126B includes, but is not limited to, polyimides. The inorganic material of the first PIS 126A and second PIS 126B includes, but is not limited to, silicon oxide ($SiO_2$), silicon nitride ($Si_3N_4$), silicon oxynitride ($Si_2N_2O$), magnesium fluoride ($MgF_2$), or combinations thereof. Adjacent first PIS 126A and second PIS 126B define a respective sub-pixel and expose the anode 104 of the respective sub-pixel circuit 100.

The sub-pixel circuit 100 has a plurality of sub-pixel lines (e.g., first sub-pixel line 106A and second sub-pixel line 106B). The sub-pixel lines are adjacent to each other along the pixel plane. Each sub-pixel line includes at least two sub-pixels. E.g., the first sub-pixel line 106A includes a first sub-pixel 108A and a second sub-pixel 108B and the second sub-pixel line 106B includes a third sub-pixel 108C and a fourth sub-pixel 108D. The first sub-pixel 108A and the second sub-pixel 108B are aligned along the line plane. The third sub-pixel 108C and the fourth sub-pixel 108D are aligned along the line plane. While FIG. 1A depicts the first sub-pixel line 106A and the second sub-pixel line 106B, the sub-pixel circuit 100 of the embodiments described herein may include two or more sub-pixel lines, such as a third sub-pixel line 106C (as shown in FIG. 1B) and a fourth sub-pixel. Each sub-pixel line has OLED materials configured to emit a white, red, green, blue or other color light when energized. E.g., the OLED materials of the first sub-pixel line 106A emits a red light when energized, the OLED materials of the second sub-pixel line 106B emits a green light when energized, the OLED materials of a third sub-pixel line 106C emits a blue light when energized, and the OLED materials of a fourth sub-pixel emits another color light when energized. The OLED materials within a pixel line may be configured to emit the same color light when energized. E.g., the OLED materials of the first sub-pixel 108A and the second sub-pixel 108B of the first sub-pixel line 106A emit a red light when energized and the OLED materials of the third sub-pixel 108C and the fourth sub-pixel 108D of the second sub-pixel line 106B emit a green light when energized.

Each sub-pixel line includes adjacent overhang structures 110, with adjacent sub-pixel lines sharing the adjacent overhang structures 110 in the pixel plane. The overhang structures 110 are permanent to the sub-pixel circuit 100. The overhang structures 110 further define each sub-pixel line of the sub-pixel circuit 100. Each overhang structure 110 includes adjacent overhangs 109. The adjacent overhangs 109 are defined by an overhang extension 109A of a second structure 110B extending laterally past an upper surface 105 of a first structure 110A. The first structure 110A is disposed over an upper surface 103A of the first PIS 126A. A first endpoint 120A of a bottom surface 118 of the first structure 110A may extend to or past a first edge 117A of the first PIS 126A. A second endpoint 120B of the bottom surface of the first structure 110A may extend to or past a second edge 117B the first PIS 126A. The second structure 110B is disposed over the first structure 110A. The second structure 110B may be disposed on the upper surface 105 of the first structure 110A. The second structure 110B may also be disposed over an intermediate structure 110C. The intermediate structure 110C may be disposed over the upper surface 105 of the first structure 110A. The intermediate structure 110C may be a seed layer or an adhesion layer. The seed layer functions as a current path for the sub-pixel circuit 100. The seed layer may include a titanium (Ti) material. The adhesion promotion layer improves adhesion between the first structure 110A and the second structure 110B. The adhesion layer may include a chromium (Cr) material.

In one embodiment, the overhang structures 110 include the second structure 110B of a conductive inorganic material and the first structure 110A of a non-conductive inorganic material. The conductive materials of the second structure 110B include a copper (Cu), aluminum (Al), aluminum neodymium (AlNd), molybdenum (Mo), molybdenum tungsten (MoW), or combinations thereof. The non-conductive materials of the first structure 110A include amorphous silicon (a-Si), titanium (Ti), silicon nitride ($Si_3N_4$), silicon oxide ($SiO_2$), silicon oxynitride ($Si_2N_2O$), or combinations thereof. The overhang structures 110 are able to remain in place, i.e., are permanent.

The adjacent overhangs 109 are defined by the overhang extension 109A. At least a bottom surface 107 of the second structure 110B is wider than the upper surface 105 of the first structure 110A to form the overhang extension 109A. The overhang extension 109A of the second structure 110B forms the overhang 109 and allows for the second structure 110B to shadow the first structure 110A. The shadowing of the overhang 109 provides for evaporation deposition of an OLED material 112 and a cathode 114. The OLED material 112 may include one or more of a HIL, a HTL, an EML, and an ETL. The OLED material 112 is disposed over and in contact with the anode 104. The OLED material 112 is disposed under adjacent overhangs 109 and may contact a sidewall 111 of the first structure 110A. In one embodiment, the OLED material 112 is different from the material of the first structure 110A, the second structure 110B, and the intermediate structure 110C. The cathode 114 is disposed over the OLED material 112 and extends under the adjacent overhangs 109. The cathode 114 may extend past an endpoint of the OLED material 112. The cathode 114 may the sidewall 111 of the first structure 110A. The overhang structures 110 and an evaporation angle set by an evaporation source define deposition angles, i.e., the overhang structures provide for a shadowing effect during evaporation deposition with the evaporation angle set by the evaporation source.

The cathode 114 includes a conductive material, such as a metal. E.g., the cathode 114 includes, but is not limited to, silver, magnesium, chromium, titanium, aluminum, ITO, or a combination thereof. In one embodiment, material of the cathode 114 is different from the material of the first structure 110A, the second structure 110B, and intermediate structure 110C. In some embodiments, e.g., as shown in FIG. 1A as applied to the sub-pixel circuit 100, the OLED material 112 and the cathode 114 are disposed over a sidewall 113 of the second structure 110B of the overhang structures 110 in the pixel plane. In other embodiments, the OLED material 112 and the cathode 114 are disposed over an upper surface 115 of the second structure 110B of the overhang structures 110 in the pixel plane. In still other embodiments, the OLED material 112 and the cathode 114 end on the sidewall 111 of the first structure 110A, i.e., are not disposed over the sidewall 113 of the second structure 110B or the upper surface 115 of the second structure 110B in the pixel plane.

Each sub-pixel 106 includes an encapsulation layer 116. The encapsulation layer 116 may be or may correspond to a local passivation layer. The encapsulation layer 116 of a respective sub-pixel is disposed over the cathode 114 (and OLED material 112) with the encapsulation layer 116 extending under at least a portion of each of the overhangs 109 and along a sidewall 111 of each of the first structure 110A and the second structure 110B. The encapsulation layer 116 is disposed over the cathode 114 and extends at least to contact the cathode 114 over the sidewall 111 of the first structure 110A in the pixel plane. In some embodiments, the encapsulation layer 116 extends to contact the sidewall 111 of the first structure 110A. In the illustrated embodiments as shown in FIGS. 1A and 1B, the encapsulation layer 116 extends to contact the second structure 110B at an underside surface of the overhang extension 109A, the sidewall 113 of the second structure 110B, and the upper surface 115 of the second structure 110B. In some embodiments, the encapsulation layer 116 extends to contact the second structure 110B at an underside surface of the overhang extension 109A and to be disposed over the OLED material 112 and the cathode 114 when the OLED material 112 and the cathode 114 are disposed over the sidewall 113 and upper surface 115 of the second structure 110B. In some embodiments, the encapsulation layer 116 ends at the sidewall 111 of the first structure 110A, i.e., is not disposed over the sidewall 113 of the second structure 110B, the upper surface 115 of the second structure 110B, or the underside surface of the overhang extension 109A of the overhang structures 110. The encapsulation layer 116 includes the non-conductive inorganic material, such as the silicon-containing material. The silicon-containing material may include $Si_3N_4$ containing materials.

Each sub-pixel line includes adjacent separation structures 125, with adjacent sub-pixels sharing the adjacent separation structures 125 in the line plane. The separation structures 125 are permanent to the sub-pixel circuit 100. The separation structures 125 further define each sub-pixel of the sub-pixel line of the sub-pixel circuit 100. The separation structures 125 are disposed over an upper surface 103B of the second PIS 126B. A first endpoint 129A of a bottom surface 128 of the separation structures 125 may extend to or past a first edge 127A of the second PIS 126B. A second endpoint 129B of the bottom surface 128 of the separation structures 125 may extend to or past a second edge 127B the second PIS 126B.

The OLED material 112 is disposed over and in contact with the anode 104 and the separation structure 125 in the line plane. The cathode 114 is disposed over the OLED material 112 in the line plane. The encapsulation layer 116 is disposed over the cathode 114 in the line plane. As shown in FIG. 1B, the OLED material 112, the cathode 114, and the encapsulation layer 116 maintain continuity along the length of the line plane in order to apply current across each sub-pixel 106.

In embodiments including one or more capping layers, the capping layers are disposed between the cathode 114 and the encapsulation layer 116. E.g., a first capping layer and a second capping layer are disposed between the cathode 114 and the encapsulation layer 116. Each of the embodiments described herein may include one or more capping layers disposed between the cathode 114 and the encapsulation layer 116. The first capping layer may include an organic material. The second capping layer may include an inorganic material, such as lithium fluoride. The first capping layer and the second capping layer may be deposited by evaporation deposition. In another embodiment, the sub-pixel circuit 100 further includes at least a global passivation layer disposed over the overhang structure 110 and the encapsulation layer 116. In yet another embodiment, the sub-pixel includes an intermediate passivation layer disposed over the overhang structures 110 of each of the sub-pixels 106, and disposed between the encapsulation layer 116 and the global passivation layer.

Figure 1C:
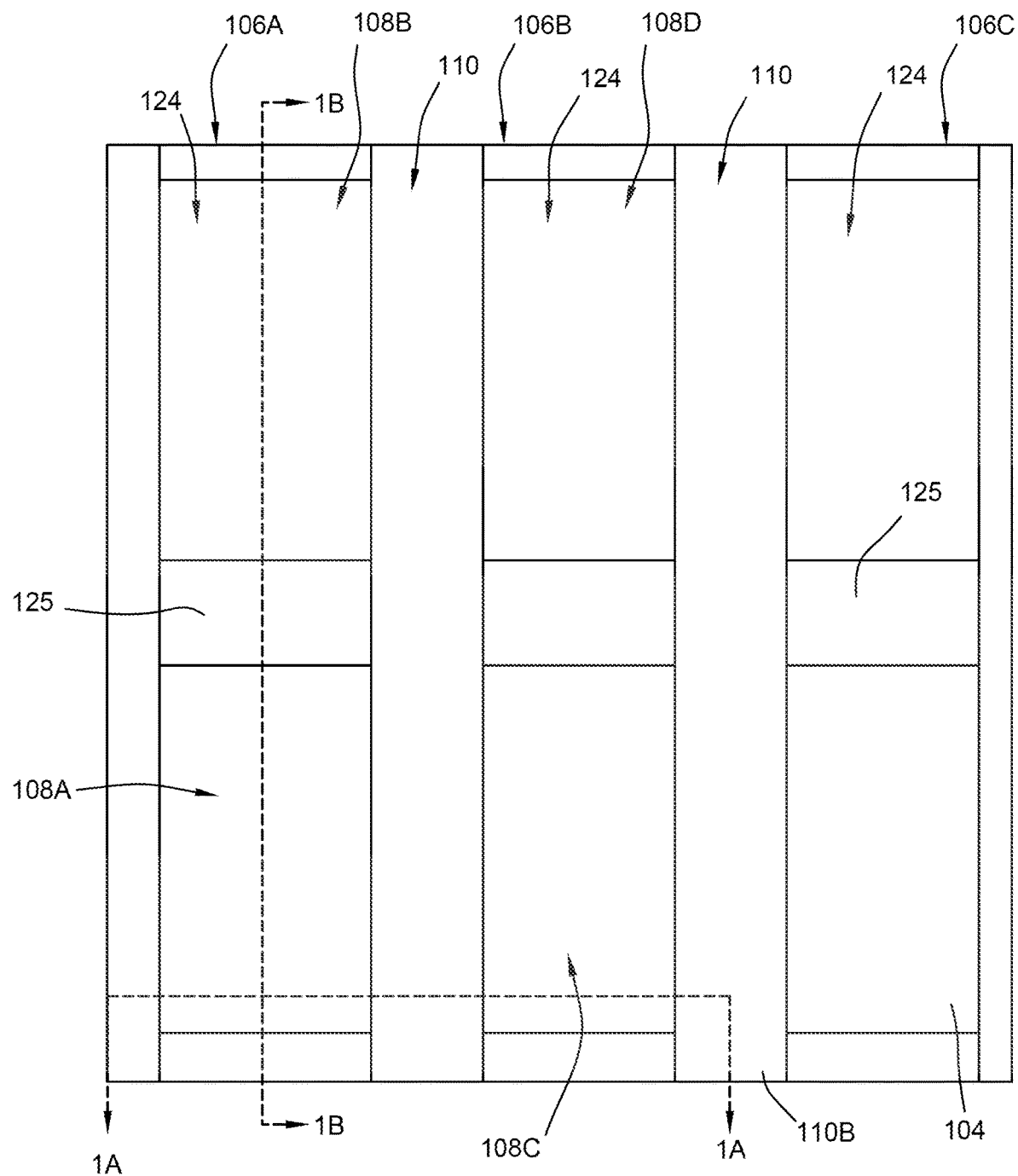
FIG. 1C is a schematic, cross-sectional view of a sub-pixel circuit having a line-type architecture at section line 1C-1C according to embodiments.

FIG. 1C is a schematic, cross-sectional view of a sub-pixel circuit 100 having a line-type architecture 101C according to embodiments. The top sectional views of FIG. 1C is taken along section line 1C-1C of FIG. 1A. The line-type architecture 101C includes a plurality of pixel openings 124. Each of pixel opening 124 is abutted by overhang structures 110 in the pixel plane and separation structure 125 in the line plane, as shown in FIG. 1A and FIG. 1B, which define each of the sub-pixel line and sub-pixel of the line-type architecture 101C.

Figure 2:
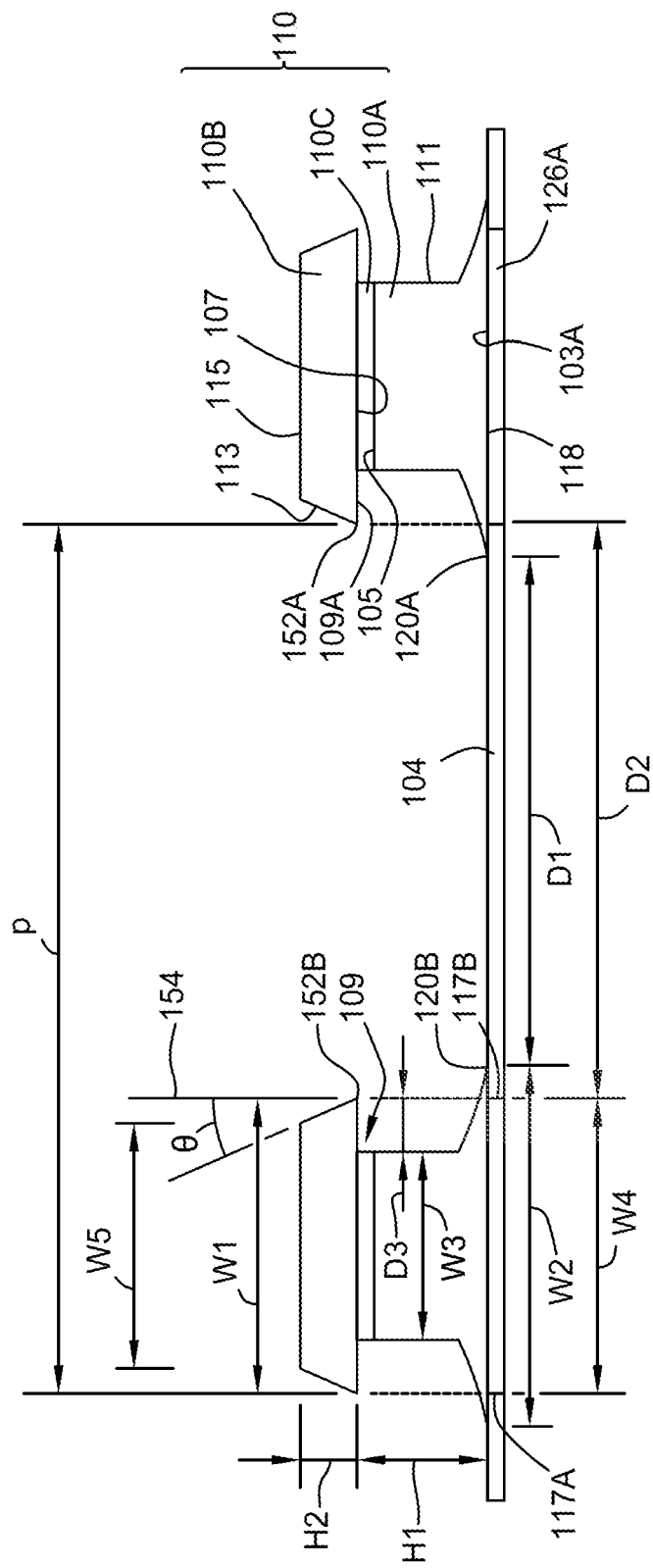
FIG. 2 is a schematic, cross-sectional view of an overhang structure according to embodiments.

FIG. 2 is a schematic, cross-sectional view of an overhang structure 110.

The overhang structure 110 is shown without the OLED material 112, the cathode 114, the encapsulation layer 116, the base layer 121, or the substrate 102. The upper surface 115 of the second structure 110B has a width W1 from a first underside edge 152A to a second underside edge 152B. The width W1 is from about 0.4 μm to about 1.2 μm. The bottom surface 118 of the first structure 110A has a width W2 from the first endpoint 120A of the bottom surface 118 to the second endpoint 120B of the bottom surface 118. The width W2 is from about 0.6 μm to about 1.4 μm. The upper surface 105 of the first structure 110A has a width W3. The width W3 is from 0.2 μm to about 0.8 μm. The first PIS 126A has a width W4 from the first edge 117A to the second edge 117B. The width W4 is from 0.4 μm to about 1.2 μm. The width W4 and the width W1 may be equal or approximately equal. The upper surface 115 of the second structure 110B has a width W5. The width W5 is from about 0.2 μm to about 1.0 μm.

The overhang structures 110 has a height H1 from the upper surface 103A of the first PIS 126A to the bottom surface 107 of the second structure 110B. The height H1 is from about 0.1 µm to about 0.5 µm. The height H1 may be the height of the first structure 110A or the height of the first structure 110A and the intermediate structure 110C. The second structure 110B has a height H2 from the bottom surface 107 to the upper surface 115. The height H2 is from about 0.15 µm to about 0.25 µm. A width of the upper surface 115 of the second structure 110B is less than the width of the bottom surface 107 of the second structure 110B. The sidewall 113 of the second structure 110B has an angle θ with respect to an overhang vector 154 of about 15° to about 45°.

The sub-pixel circuit 100 has a pitch p. The pitch p is the distance from a first edge 117A of the first PIS 126A to the first edge 117A of an adjacent first PIS 126A. The pitch p is from about 2 µm to about 8 µm. The sub-pixel circuit 100 has a distance D1 from the second endpoint 120B of the first structure 110A of an overhang structure 110 to a first endpoint 120A of the first structure 110A of an adjacent overhang structure 110. The distance D1 is from about 2 µm to about 6 µm. The sub-pixel circuit 100 has a distance D2 from the second edge 117B of the first PIS 126A to the first edge 117A of the first PIS 126A of an adjacent overhang structure 110 (e.g., a width of the anode 104). The distance D2 is from 2 µm to about 6 µm. The distance D1 and the distance D2 may be equal or approximately equal. The overhang structure 110 has a distance D3 from a first underside edge 152A or a second underside edge 152B of the second structure 110B to the sidewall 111 of the first structure 110A. The distance D3 is less than about 0.15 µm.

Figure 3:
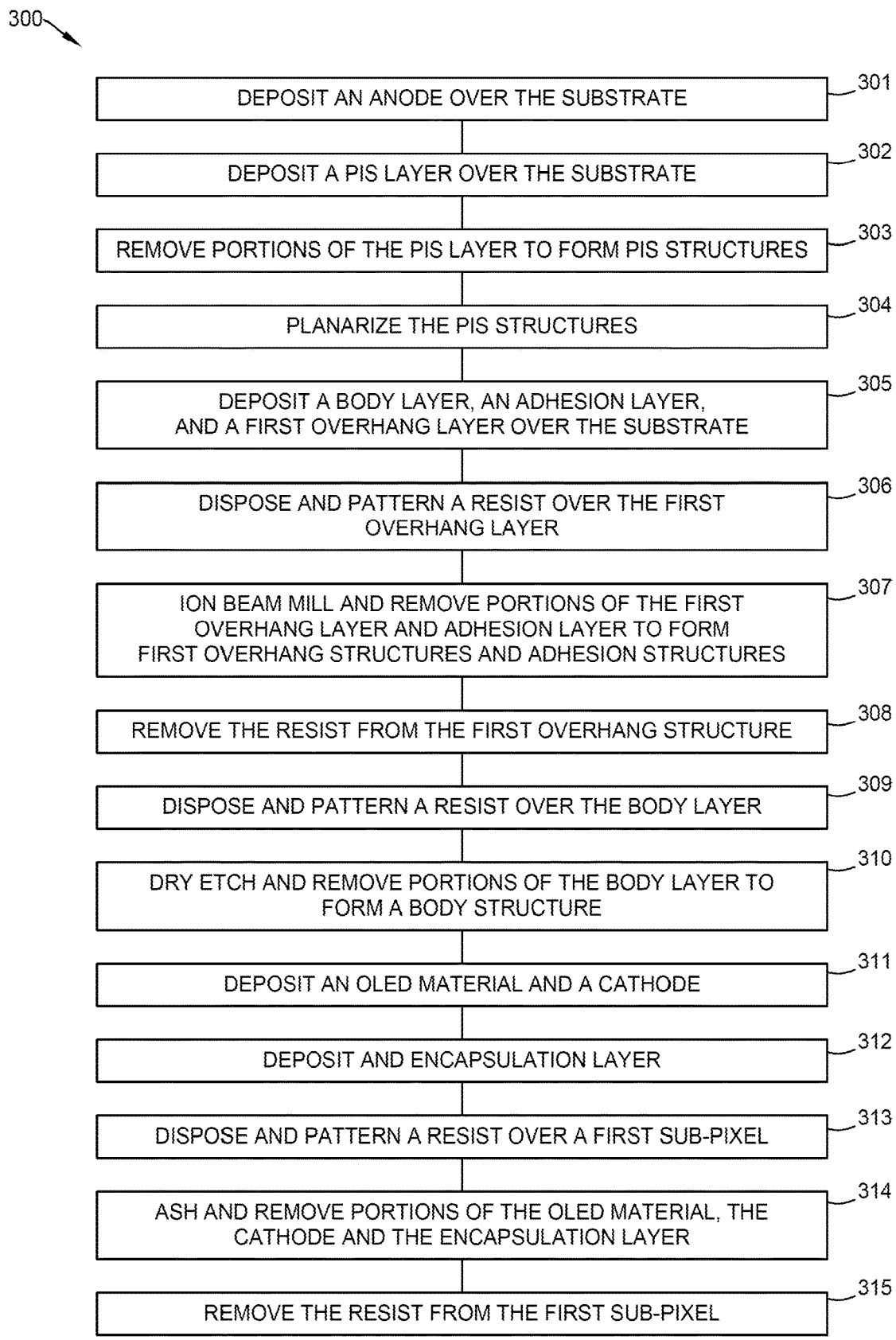
FIG. 3 is a flow diagram of a method for forming a sub-pixel according to according to embodiments.
Figure 4A:
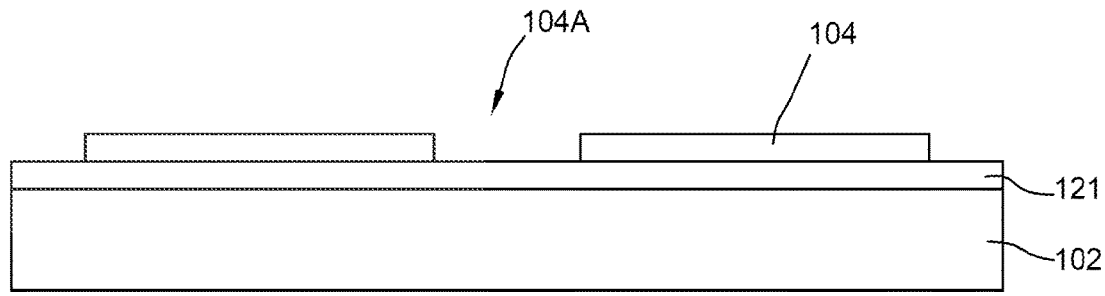
FIGS. 4A-4R are schematic, cross-sectional views of a substrate during a method of forming a sub-pixel according to embodiments.

FIG. 3 is a flow diagram of a method 300 for forming a sub-pixel circuit 100 according to embodiment. FIG. 4A-4R are schematic, cross-sectional views of a substrate 102 during a method 300 for forming a sub-pixel circuit 100 according to embodiments described herein.

At operation 301, as shown in FIG. 4A (along the pixel plane), an anode 104 is deposited over the substrate 102. The anode 104 may be deposited on the substrate 102. In another embodiment, the anode 104 is deposited on a base layer 121. The base layer 121 is disposed on the substrate 102. The anode 104 may be deposited using metal-organic decomposition (MOD). An anode gap 104A separates the anode 104 from an adjacent anode 104.

Figure 4B:
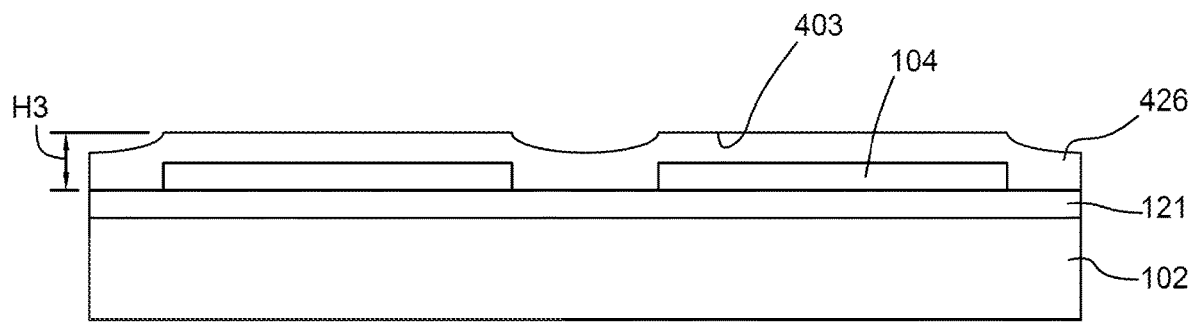

At operation 302, as shown in FIG. 4B (along the pixel plane), a PIS layer 426 is deposited over the substrate 102. The PIS layer 426 may be deposited on the anode 104 and on the base layer 121 in the anode gap 104A. A height H3 from the base layer 121 to an upper surface 403 of the PIS layer 426 is from about 400 nm to about 700 nm.

Figure 4C:
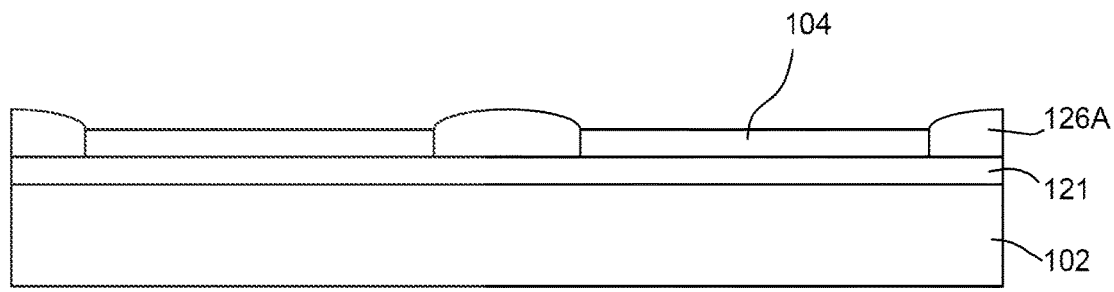
Figure 4D:
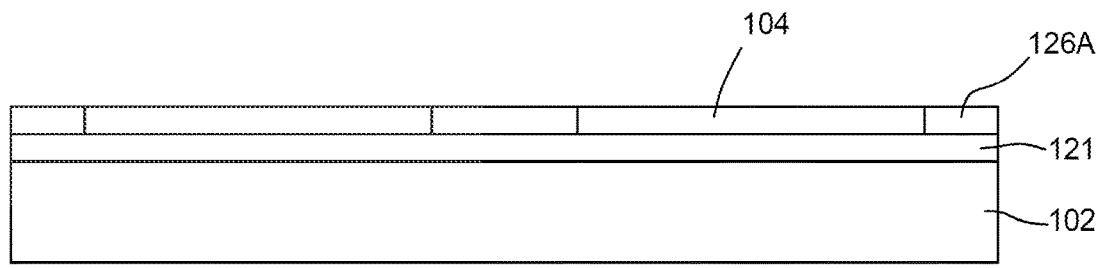

At operation 303, as shown in FIG. 4C (along the pixel plane), portions of the PIS layer 426 are removed. The PIS layer 426 may be removed by a wet etch or dry etch process. Operations 303 exposes the anode 104 and forms a plurality of first PIS 126A and second PIS 126B. At operation 304, as shown in FIG. 4D (along the pixel plane), the first PIS 126A and second PIS 126B are planarized. The upper surface 103A of the first PIS 126A and the upper surface 103B of the second PIS 126B are aligned with the upper surface of the anode 104. The first PIS 126A and second PIS 126B are cured at a temperature of about 140° C. to about 180° C. for about 10 minutes to about 20 minutes. The curing of the first PIS 126A and second PIS 126B enables shrinkage of the first PIS 126A and second PIS 126B. The first PIS 126A and second PIS 126B are planarized after curing. The planarization process of the first PIS 126A and second PIS 126B may be performed using chemical-mechanical planarization (CMP).

Figure 4E:
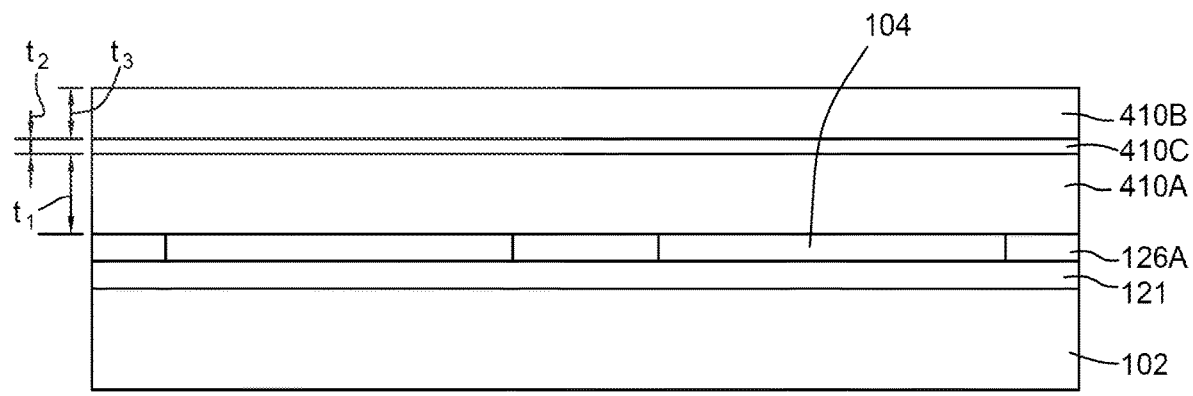

At operation 305, as shown in FIG. 4E (along the pixel plane), a first structure layer 410A, second structure layer 410B, and intermediate layer 410C are deposited over the substrate 102. The first structure layer 410A is deposited on the anode 104 and the first PIS 126A and second PIS 126B. The first structure layer 410A has a thickness $t_1$ from about 0.1 µm to about 0.5 µm. The intermediate layer 410C is deposited on the first structure layer 410A. The intermediate layer 410C has a thickness $t_2$ less than about 50 nm. The second structure layer 410B is deposited on the intermediate layer 410C. The second structure layer 410B is deposited using sputtering deposition The second structure layer 410B has a thickness $t_3$ from about 0.15 µm to about 0.25 µm.

Figure 4F:
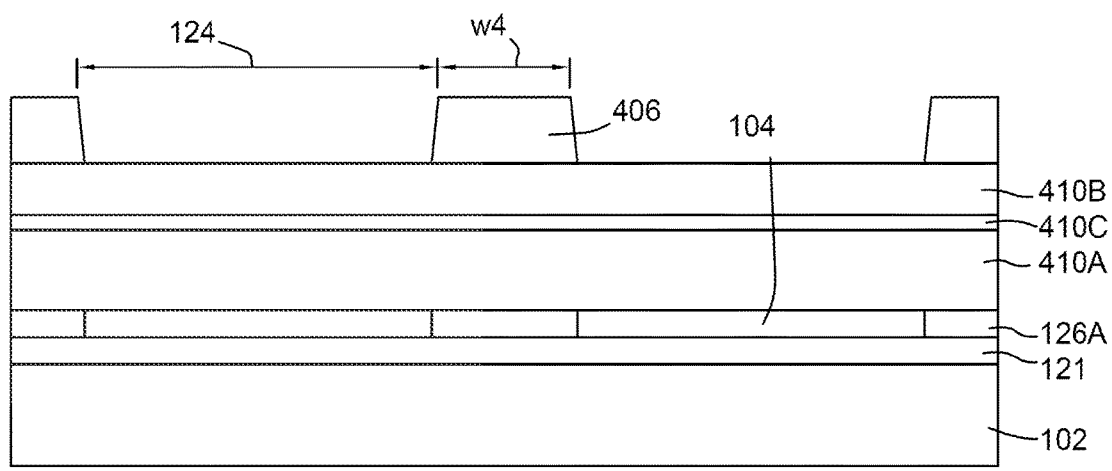

At operation 306, as shown in FIG. 4F (along the pixel plane), a resist 406 is disposed and patterned. The resist 406 is disposed over the second structure layer 410B. The resist 406 may have a width $W_4$ of about 0.8 µm to about 1.2 µm. The resist is a positive resist or a negative resist. A positive resist includes portions of the resist, which, when exposed to electromagnetic radiation, are respectively soluble to a resist developer applied to the resist after the pattern is written into the resist using the electromagnetic radiation. A negative resist includes portions of the resist, which, when exposed to radiation, will be respectively insoluble to the resist developer applied to the resist after the pattern is written into the resist using the electromagnetic radiation. The chemical composition of the resist 406 determines whether the resist is a positive resist or a negative resist. The portion of the second structure layer 410B that has the resist 406 disposed thereon is patterned to form a pixel opening 124 of the line-type architecture 101C of a first sub-pixel line 106A. The patterning is one of a photolithography, digital lithography process, or laser ablation process.

Figure 4G:
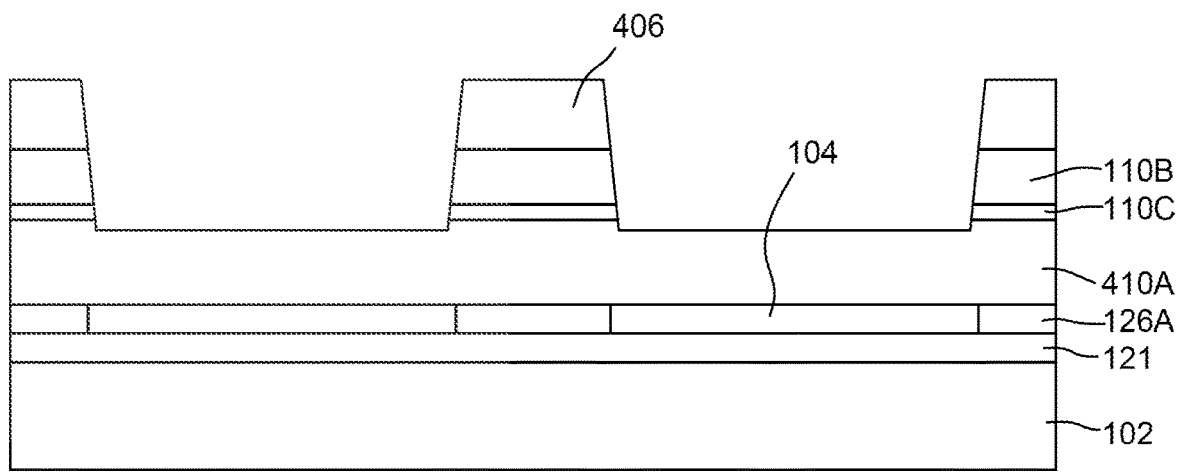
Figure 4H:
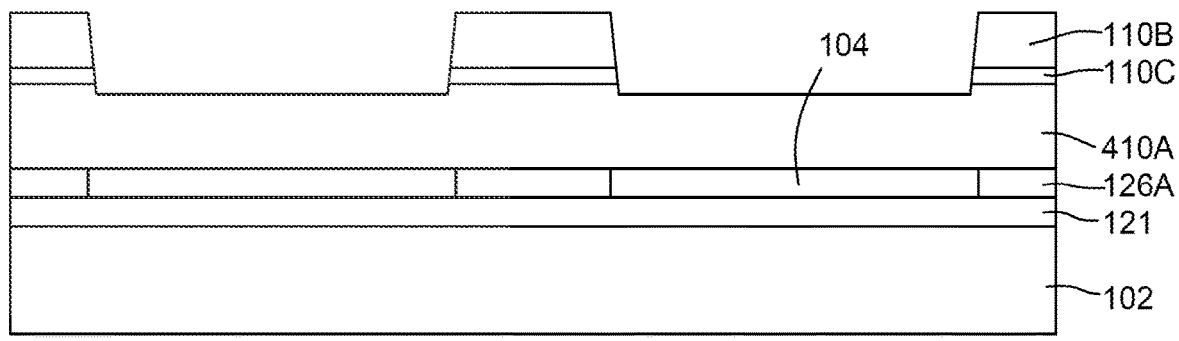

At operation 307, as shown in FIG. 4G (along the pixel plane), portions of the second structure layer 410B and intermediate layer 410C exposed by the pixel opening 124 are removed. The second structure layer 410B and the intermediate layer 410C are removed by ion beam milling. In some embodiments, a portion of the first structure layer 410A may be removed, e.g., about less than 50 nm of the first structure layer 410A may be removed. Operations 307 forms the second structure 110B and the intermediate structure 110C. At operation 308, as shown in FIG. 4H (along the pixel plane), the resist 406 is removed from the second structure 110B.

Figure 4I:
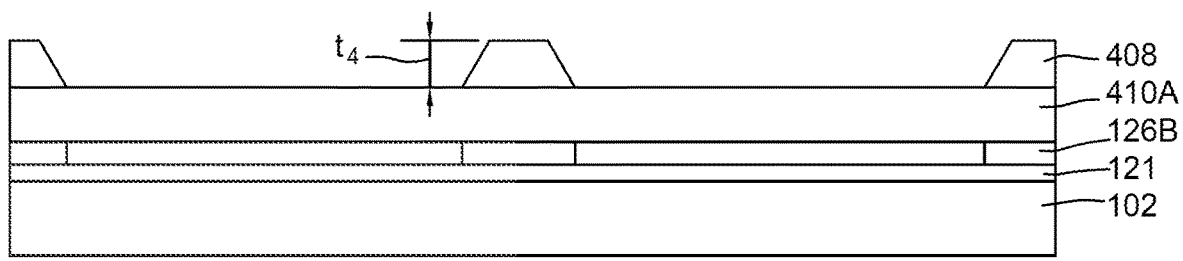

At operation 309, as shown in FIG. 4I (along the line plane), a resist 408 is disposed and patterned. The resist 408 is disposed over the first structure layer 410A. The resist 408 has a thickness $t_4$ less than about 500 nm. The resist 408 has a taper from a bottom surface to an upper surface of about 40° to 50°, where the bottom surface of the resist 408 has a width that is greater than the upper surface of the resist 408. The resist 408 is a positive resist or a negative resist. The chemical composition of the resist 408 determine whether the resist 408 is a positive resist or a negative resist. The portion of the first structure layer 410A that has the resist 408 disposed thereon is patterned to form a pixel opening 124 of the line-type architecture 101C of the first sub-pixel line 106A. The patterning is one of a photolithography, digital lithography process, or laser ablation process.

Figure 4J:
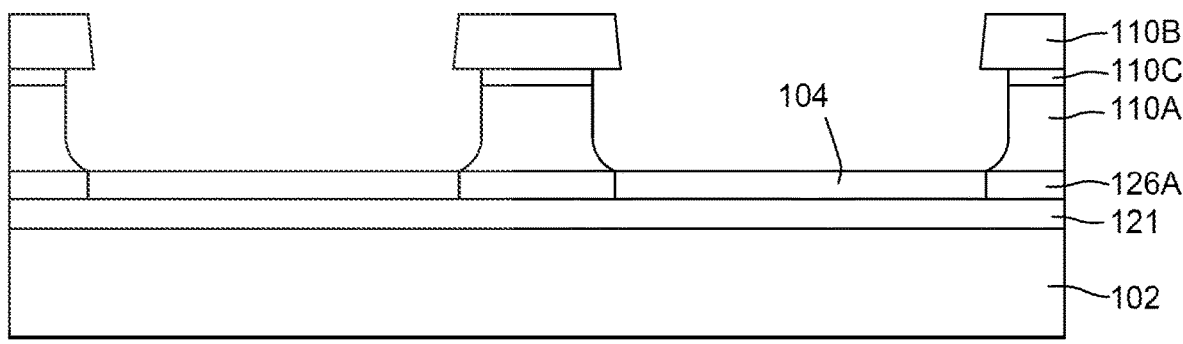
Figure 4K:
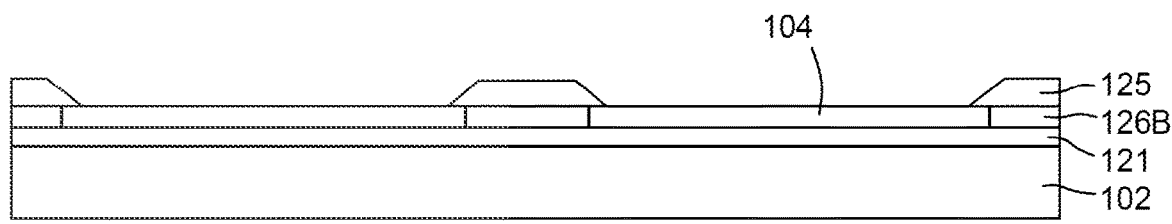

At operation 310, as shown in FIG. 4J (along the pixel plane) and FIG. 4K (along the line plane), portions of the first structure layer 410A exposed by the pixel opening 124 and the resist 408 are removed. The first structure layer 410A and resist 408 are removed using dry etching. Operation 310 forms the first structure 110A and the separation structures 125. The etch selectivity between the materials of the second structure layer 410B corresponding to the second structure 110B, the first structure layer 410A corresponding to the first structure 110A, and the etch processes to remove the exposed portions of the second structure layer 410B and the first structure layer 410A provide for the bottom surface 107 of the second structure 110B being wider than the upper surface 105 of the first structure 110A to form an overhang extension 109A of the adjacent overhangs 109. The shadowing of the adjacent overhangs 109 provide for evaporation deposition of the OLED material 112 and the cathode 114.

Figure 4L:
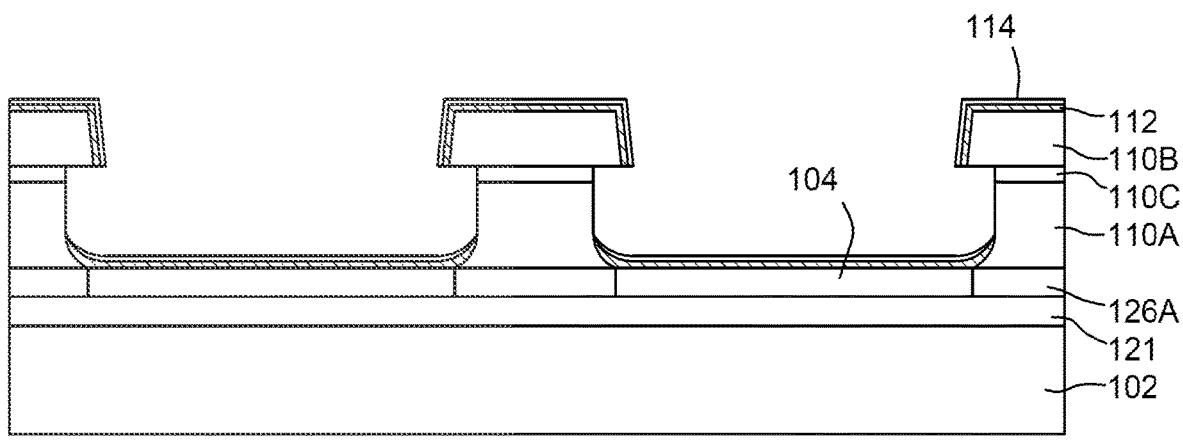
Figure 4M:
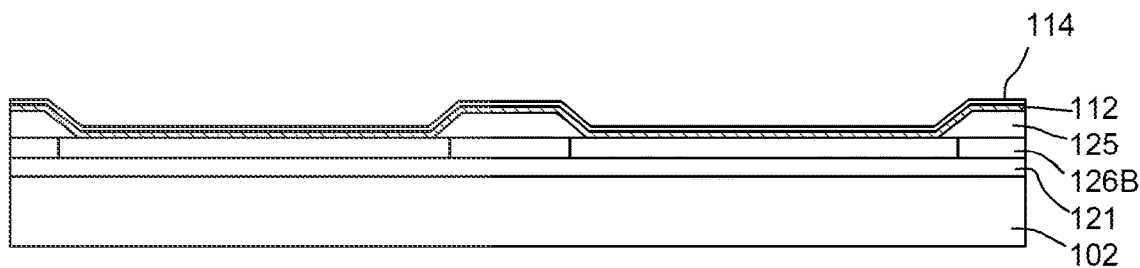

At operation 311, as shown in FIG. 4L (along pixel plane) and FIG. 4M (along the line plane), the OLED material 112 of the first sub-pixel line 106A and the cathode 114 are deposited. The OLED material 112 includes an HIL material. The shadowing of the adjacent overhangs 109 provides for evaporation deposition of each of the OLED material 112 and the cathode 114. The OLED material 112 and the cathode 114 may separate (e.g., may be non-continuous) along the pixel plane. The OLED material 112 and cathode 114 maintain continuity along the line plane, e.g., the OLED material 112 and the cathode 114 are disposed over the separations structures 125. The total thickness of the OLED material 112 and the cathode 114 is from about 100 nm to about 150 nm.

Figure 4N:
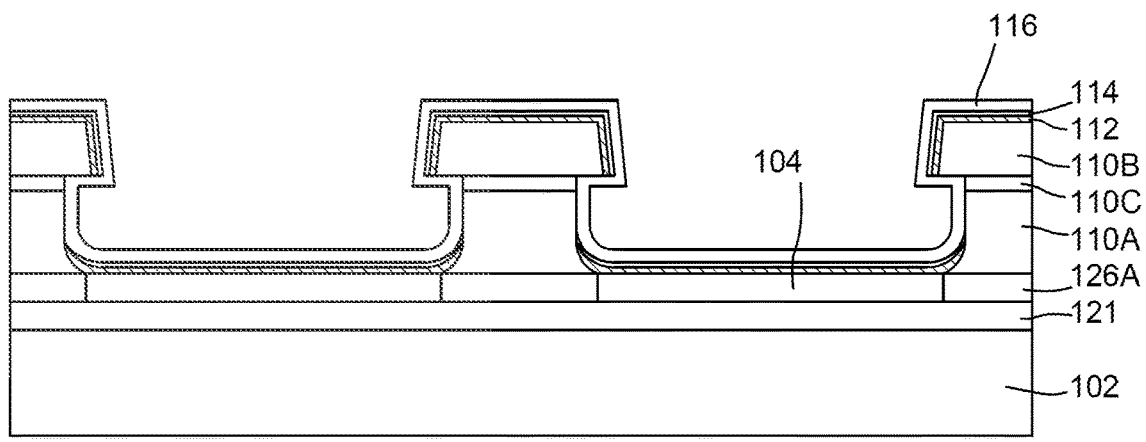

At operation 312, as shown in FIG. 4N (along the pixel plane), the encapsulation layer 116 is deposited. The encapsulation layer 116 is deposited over the cathode 114. A thickness of the encapsulation layer is from about 10 nm to about 50 nm. The shadowing of the adjacent overhangs 109 provides for evaporation deposition of the encapsulation layer 116. The encapsulation layer 116 may maintain continuity along the pixel plane and the line plane.

Figure 4O:
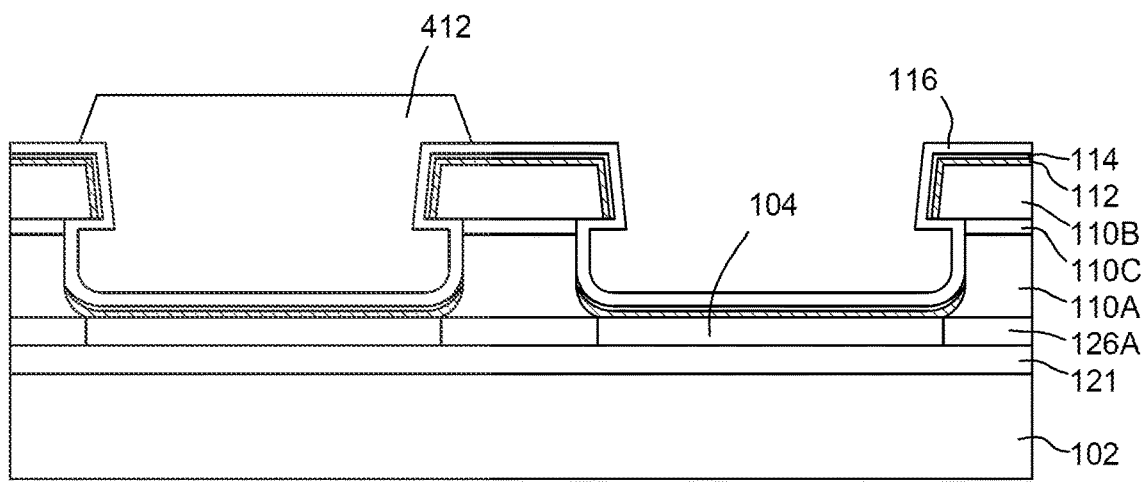
Figure 4P:
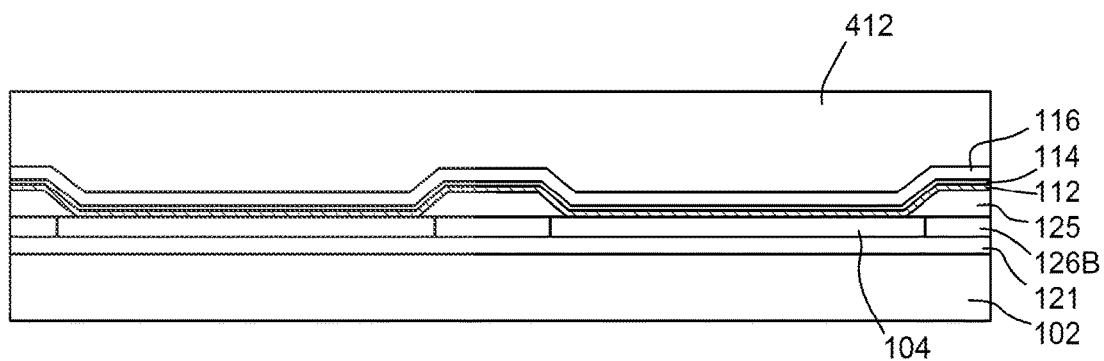

At operation 313, as shown in FIG. 4O (along the pixel plane) and FIG. 4P (along the line plane), a resist 412 is disposed in the first sub-pixel line 106A. The resist 412 is a positive resist or a negative resist. The chemical composition of the resist 412 determine whether the resist 412 is a positive resist or a negative resist. The resist 412 is patterned to protect the first sub-pixel line 106A from the subsequent etching processes. The resist 412 extends over the first sub-pixel 108A and the second sub-pixel 108B. The patterning is one of a photolithography, digital lithography process, or laser ablation process. The resist 412 has a width W6 extending over the upper surface 115 of the second structure 110B of less than about 150 nm. The width W6 limit the overexposure of the OLED material 112 and cathode 114 disposed under the adjacent overhangs 109.

Figure 4Q:
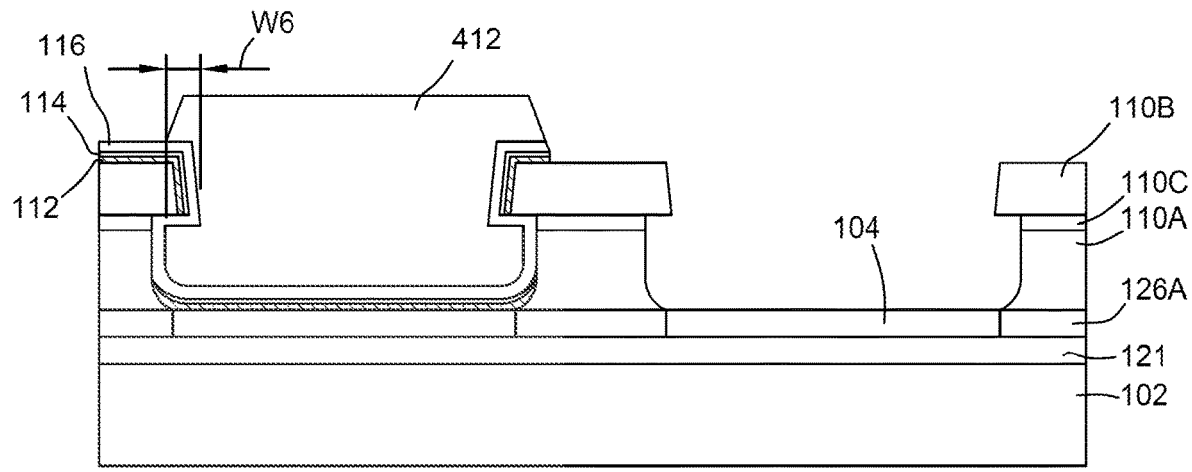
Figure 4R:
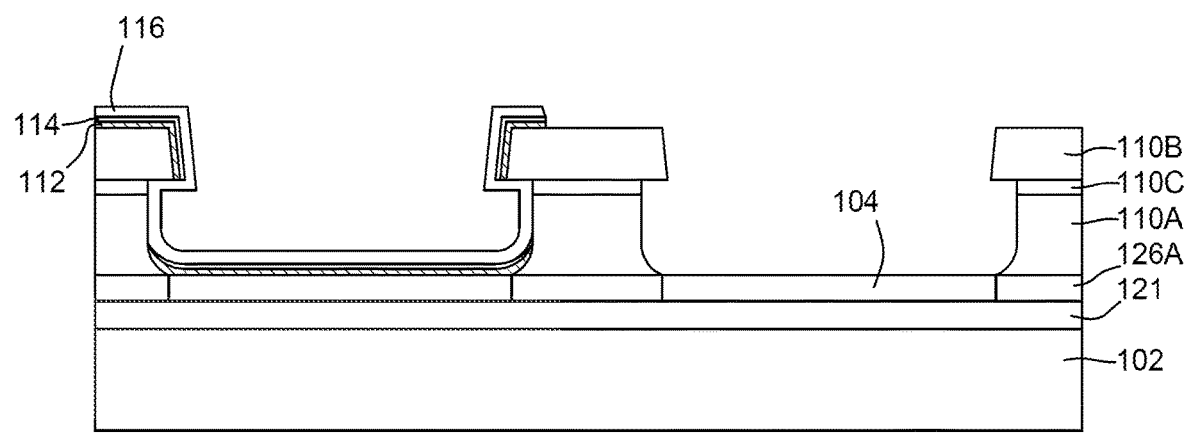

At operation 314, as shown in FIG. 4Q (along the pixel plane), portions of the OLED material 112, the cathode 114, and the encapsulation layer 116 exposed by the resist 412 are removed. The portions of the OLED material 112, the cathode 114, and the encapsulation layer 116 may be removed using ashing (e.g., $O_2$ ashing). The surface of the anode 104 may be cleaned using UV ozone ($O_3$) cleaning.

At operation 315, as shown in FIG. 4R (along the pixel plane), the resist 412 is removed from the first sub-pixel line 106A, leaving behind the first sub-pixel 108A and second sub-pixel 108B of the first sub-pixel line 106A. Operations 311 to 317 may be repeated until the desired number of sub-pixels are formed.

Figure 5:
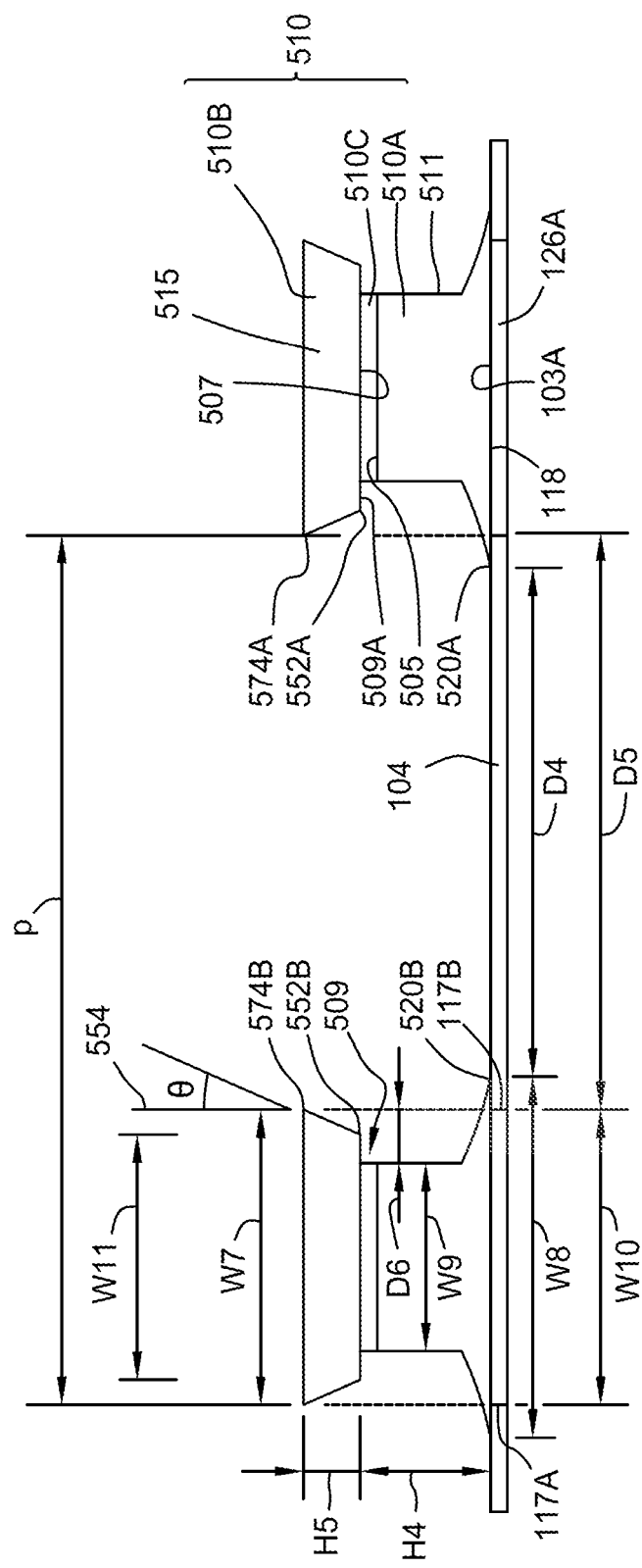
FIG. 5 is a schematic, cross-sectional view of an overhang structure according to embodiments.

FIG. 5 is a schematic, cross-sectional view of an overhang structure 510. The overhang structure 510 may be used in place of the overhang structure 110 in a sub-pixel circuit 100. The overhang structure 510 is shown without the OLED material 112, the cathode 114, the encapsulation layer 116, the base layer 121, or the substrate 102. The overhang structure 510 includes a first structure 510A, a second structure 510B, and an intermediate structure 510C. The first structure 510A is disposed over the first PIS 126A. The intermediate structure 510C is disposed over the first structure 510A. The second structure 510B is disposed over the intermediate structure 510C. In the illustrated embodiment, the intermediate structures 510C is a seed layer that provides a current path through the sub-pixel circuit 100. The intermediate structure 510C includes a titanium (Ti) material.

The upper surface 515 of the second structure 510B has a width W7 from a first upperside edge 574A of the second structure 510B to a second upperside edge 574B of the second structure 510B. The width W7 is from about 0.4 µm to about 1.2 µm. The first structure 510A has a width W8 from the first endpoint 520A of the bottom surface 518 to the second endpoint 520B of the bottom surface 518. The width W8 is from about 0.6 µm to about 1.4 µm. The upper surface 505 of the first structure 510A has a width W9. The width W9 is from 0.2 µm to about 0.8 µm. The first PIS 126A has a width W10 from the first edge 117A to the second edge 117B. The width W10 is from 0.4 µm to about 1.2 µm. The bottom surface 509 of the second structure 510B has a width W11 from a first underside edge 552A to a second underside edge 552B. The width W11 is from about 0.2 µm to about 1.0 µm. The width W7 and the width W10 may be equal or approximately equal. A width W11 of the bottom surface 507 of the second structure 510B is less than the width of the upper surface 515 of the second structure 510B.

The overhang structures 510 have a height H3 from the upper surface 103A of the first PIS 126A to the bottom surface 507 of the second structure 510B. The height H4 is from about 0.1 µm to about 0.5 µm. The height H4 may be the height of the first structure 510A or the height of the first structure 510A and an intermediate structure 510C. The second structure 510B has a height H5 from the bottom surface 507 to the upper surface 515. The height H5 is from about 0.15 µm to about 0.25 µm. The sidewall 513 of the second structure 510B has an angle θ with respect to an overhang vector 554 of about 15° to about 45°.

The sub-pixel circuit 100 has a pitch p. The pitch p is the distance from the first edge 117A of the first PIS 126A to the first edge 117A of an adjacent first PIS 126A. The pitch p is from about 2 µm to about 8 µm. The sub-pixel circuit 100 has a distance D4 from the second endpoint 520B of the first structure 510A of an overhang structure 510 to a first endpoint 520A of the first structure 510A of an adjacent overhang structure 510. The distance D4 is from about 2 µm to about 6 µm. The sub-pixel circuit 100 has a distance D5 from the second edge 117B of the first PIS 126A to the first edge 117A of the adjacent first PIS 126A (e.g., a width of the anode 104). The distance D5 is from 2 µm to about 6 µm. The distance D4 and the distance D5 may be equal or approximately equal. The overhang structure 510 has a distance D6 from a first underside edge 552A or a second underside edge 552B of the second structure 510B to the sidewall 511 of the first structure 510A. The distance D6 is less than about 0.15 µm.

Figure 6:
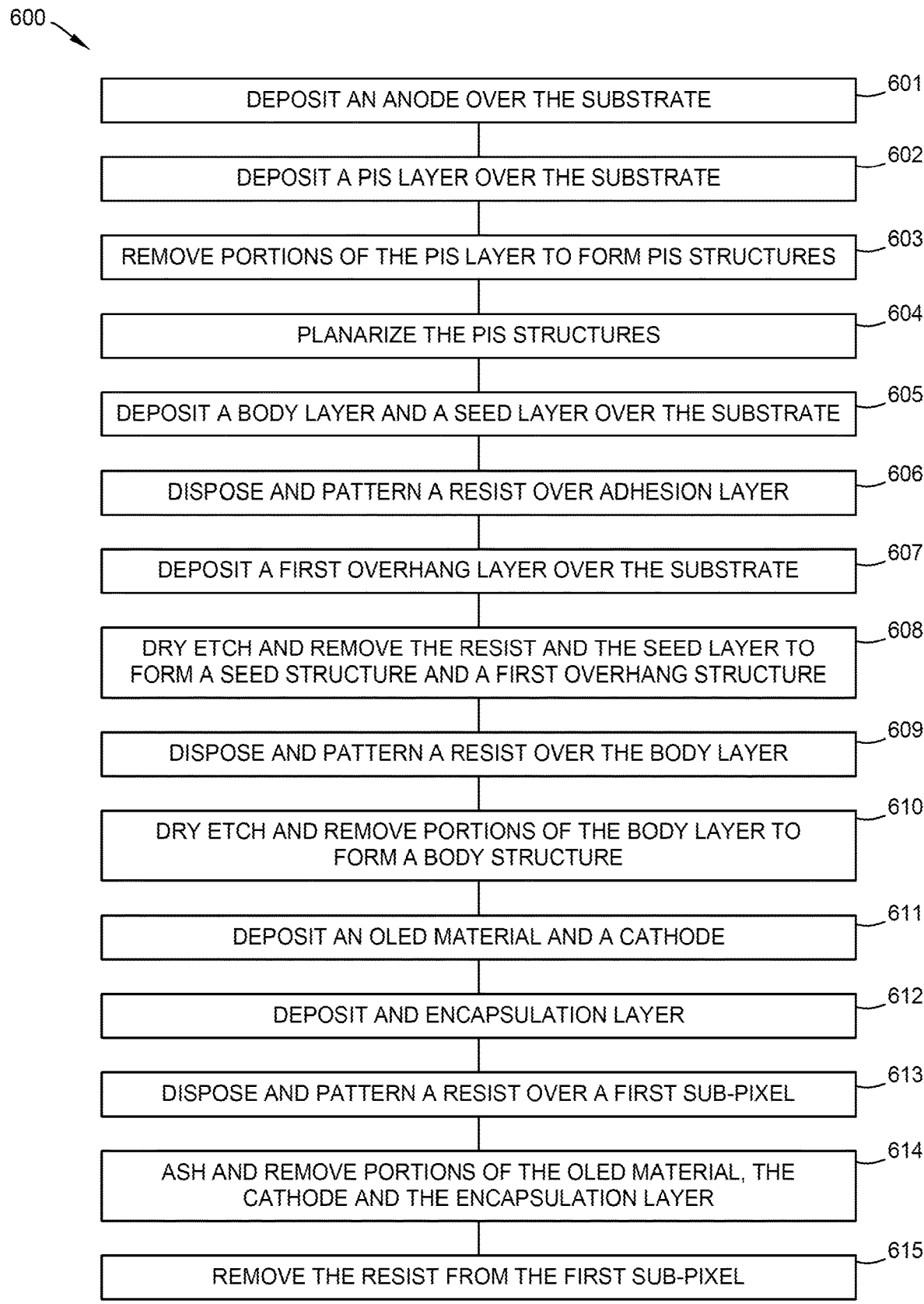
FIG. 6 is a flow diagram of a method for forming a sub-pixel according to according to embodiments.
Figure 7A:
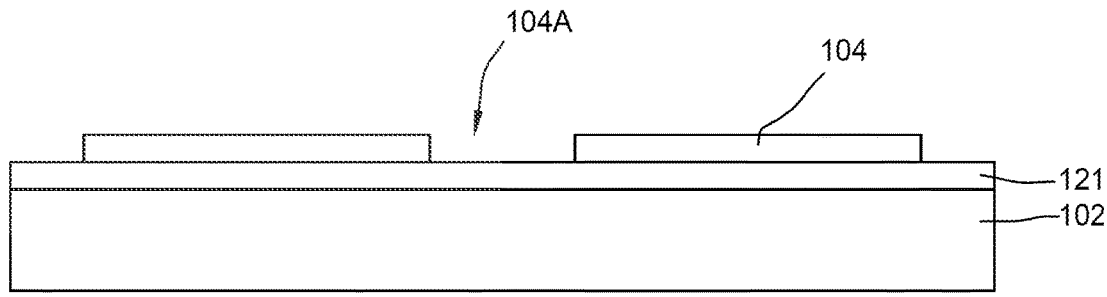
FIG. 7A-7R are schematic, cross-sectional views of a substrate during a method of forming a sub-pixel according to embodiments.

FIG. 6 is a flow diagram of a method 600 for forming a sub-pixel circuit 100 according to embodiment. FIG. 7A-7R are schematic, cross-sectional views of a substrate 102 during a method 600 for forming a sub-pixel circuit 100 according to embodiments described herein.

At operation 601, as shown in FIG. 7A (along the pixel plane), an anode 104 is deposited over the substrate 102. The anode 104 may be deposited on the substrate 102. In another embodiment, the anode 104 is deposited on a base layer 121. The base layer 121 is disposed on the substrate 102. The anode 104 may be deposited using metal-organic decomposition (MOD). An anode gap 104A separates the anode 104 from an adjacent anode 104.

Figure 7B:
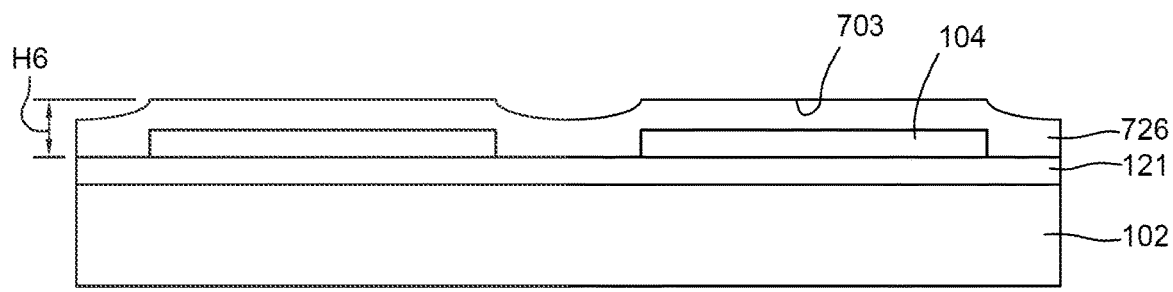

At operation 602, as shown in FIG. 7B (along the pixel plane), a PIS layer 726 is deposited over the substrate 102. The PIS layer 726 may be deposited on the anode 104 and on the base layer 121 in the anode gap 104A. A height H6 from the base layer 121 to an upper surface 703 of the PIS layer 726 is from about 400 nm to about 700 nm.

Figure 7C:
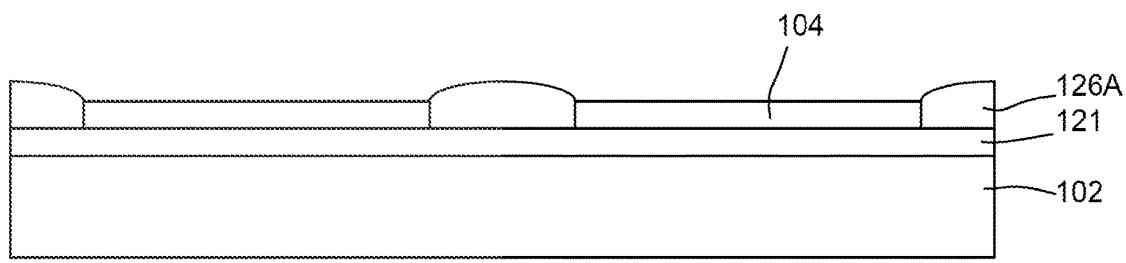
Figure 7D:
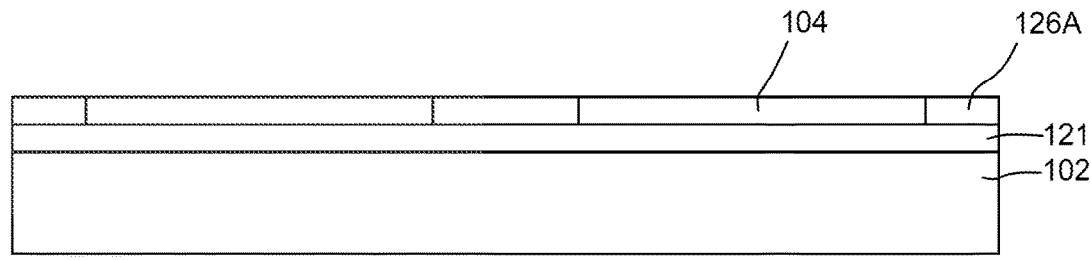

At operation 603, as shown in FIG. 7C (along the pixel plane), portions of the PIS layer 726 are removed. The PIS layer 726 may be removed by a wet etch or dry etch process. Operations 603 exposes the anode 104 and forms first PIS 126A and second PIS 126B. At operation 604, as shown in FIG. 7D (along the pixel plane), the first PIS 126A and second PIS 126B are planarized. The upper surface 103A of the first PIS 126A and the upper surface 103B of the second PIS 126B are aligned with the upper surface of the anode 104. The first PIS 126A and second PIS 126B are cured at a temperature of about 140° C. to about 180° C. for about 10 minutes to about 20 minutes. The curing of the first PIS 126A and second PIS 126B enables shrinkage of the first PIS 126A and second PIS 126B. The first PIS 126A and second PIS 126B are planarized after curing. The planarization process of the first PIS 126A and second PIS 126B may be performed using chemical-mechanical planarization (CMP).

Figure 7E:
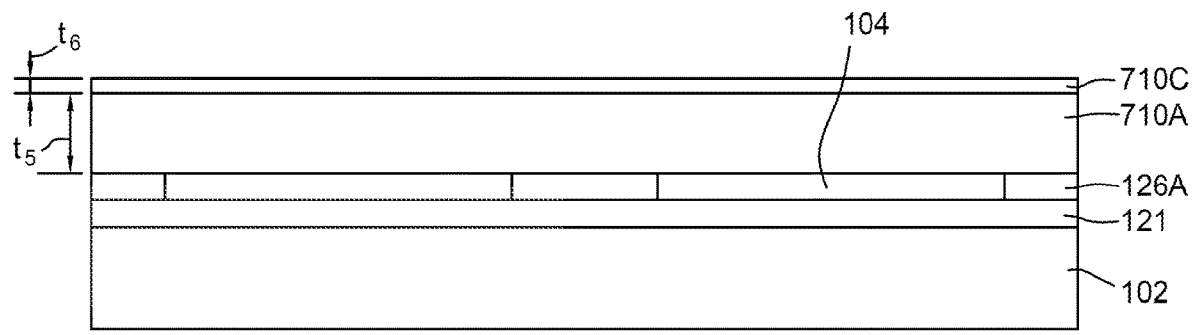

At operation 605, as shown in FIG. 7E (along the pixel plane), a first structure layer 710A and an intermediate layer 710C are deposited over the substrate 102. The first structure layer 710A is deposited on the anode 104, the first PIS 126A, and the second PIS 126B. The first structure layer 710A has a thickness $t_5$ from about 0.1 μm to about 0.5 μm. The intermediate layer 710C is deposited on the first structure layer 710A. The intermediate layer 710C has a thickness $t_6$ less than about 50 nm.

Figure 7F:
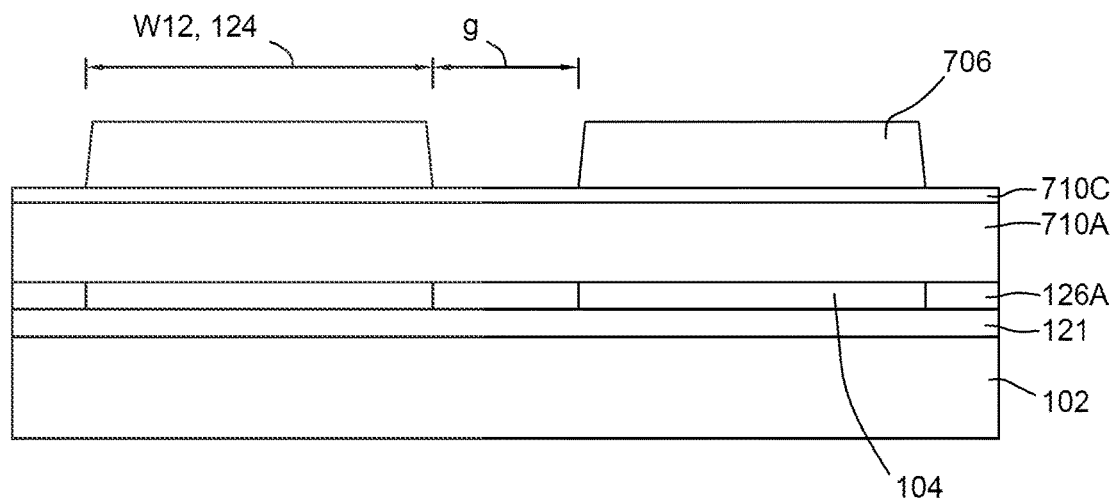

At operation 606, as shown in FIG. 7F (along the pixel plane), a resist 706 is disposed and patterned. The resist 706 is disposed over the intermediate layer 710C. The resist 706 may have a width W12 of about 0.8 μm to about 1.2 μm. The resist is a positive resist or a negative resist. A positive resist includes portions of the resist, which, when exposed to electromagnetic radiation, are respectively soluble to a resist developer applied to the resist after the pattern is written into the resist using the electromagnetic radiation. A negative resist includes portions of the resist, which, when exposed to radiation, will be respectively insoluble to the resist developer applied to the resist after the pattern is written into the resist using the electromagnetic radiation. The chemical composition of the resist 706 determines whether the resist is a positive resist or a negative resist. The resist 706 defines a gap g between adjacent resists 706. The gap g has a distance from about 3.8 μm to about 4.6 μm. The resist 706 is patterned to form a pixel opening 124 of the line-type architecture 101C of a first sub-pixel line 106A. The patterning is one of a photolithography, digital lithography process, or laser ablation process.

Figure 7G:
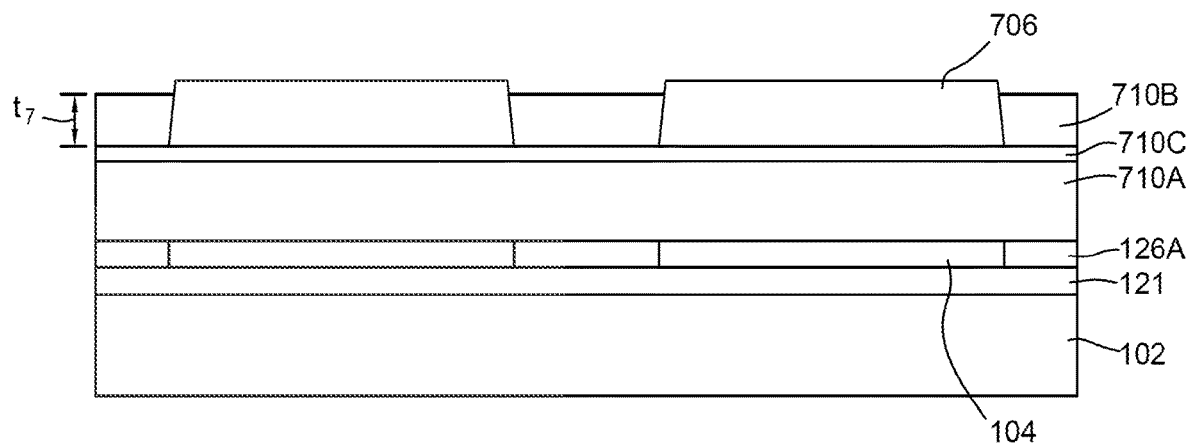

At operation 607, as shown in FIG. 7G (along the pixel plane), a second structure layer 7108 is deposited over the substrate 102. The second structure layer 710B may be deposited on the intermediate layer 710C in the gap g. The second structure layer 4108 is deposited using metal electroplating. The second structure layer 710B has a thickness $t_7$ from about 0.25 μm to about 0.35 μm.

Figure 7H:
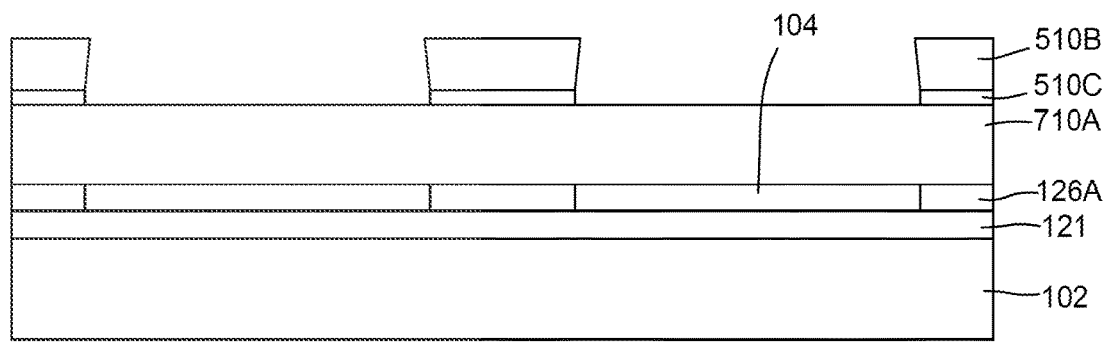

At operation 608, as shown in FIG. 7H (along the pixel plane), the resist 706 and portions of the intermediate layer 710C disposed under the resist 706 are removed. The resist 706 and the intermediate layer 710C are removed by dry etching. Operation 607 forms the second structure 5108 and the intermediate structure 510C.

Figure 7I:
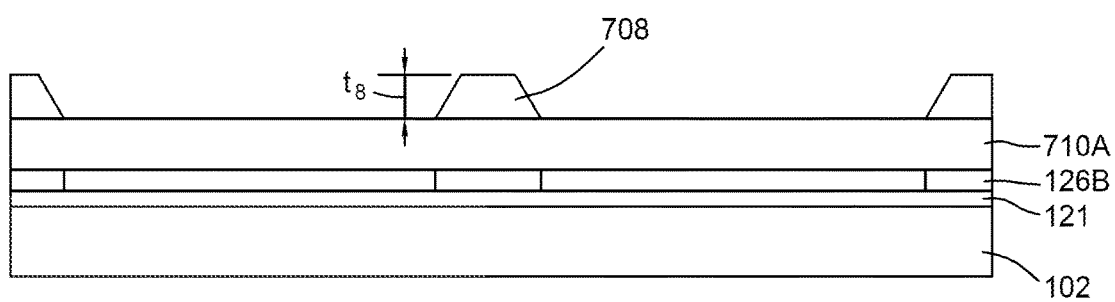

At operation 609, as shown in FIG. 7I (along the line plane), a resist 708 is disposed and patterned. The resist 708 is disposed over the first structure layer 710A. The resist 708 has a thickness is less than about 500 nm. The resist 708 has a taper from a bottom surface to an upper surface of about 40° to 50°, where the bottom surface of the resist 708 has a width that is greater than the upper surface of the resist 708. The resist 708 is a positive resist or a negative resist. The chemical composition of the resist 708 determine whether the resist 708 is a positive resist or a negative resist. The portion of the first structure layer 710A that has the resist 708 disposed thereon is patterned to form a pixel opening 124 of the line-type architecture 101C of the first sub-pixel line 106A. The patterning is one of a photolithography, digital lithography process, or laser ablation process.

Figure 7J:
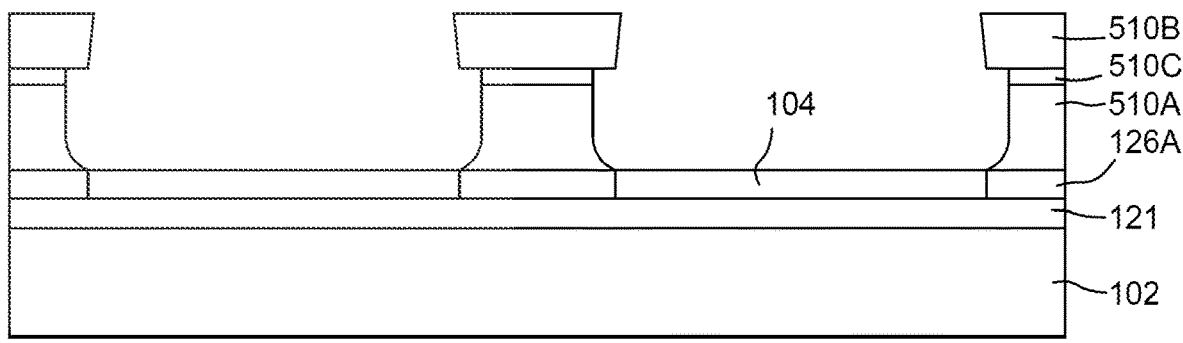
Figure 7K:
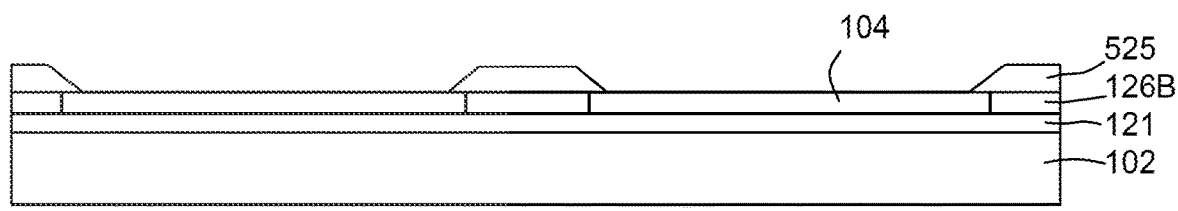

At operation 610, as shown in FIG. 7J (along the pixel plane) and FIG. 7K (along the line plane), portions of the first structure layer 710A exposed by the pixel opening 124 and the resist 708 are removed. The first structure layer 710A and resist 708 are removed using dry etching. Operation 610 forms the first structure 510A and the separation structure 525. The etch selectivity between the materials of the second structure layer 6108 corresponding to the second structure 5106, the first structure layer 610A corresponding to the first structure 510A, and the etch processes to remove the exposed portions of the second structure layer 610B and the first structure layer 610A provide for the bottom surface 507 of the second structure 510B being wider than the upper surface 505 of the first structure 510A to form an overhang extension 509A of the adjacent overhangs 509. The shadowing of the adjacent overhangs 509 provide for evaporation deposition of the OLED material 112 and the cathode 114.

Figure 7L:
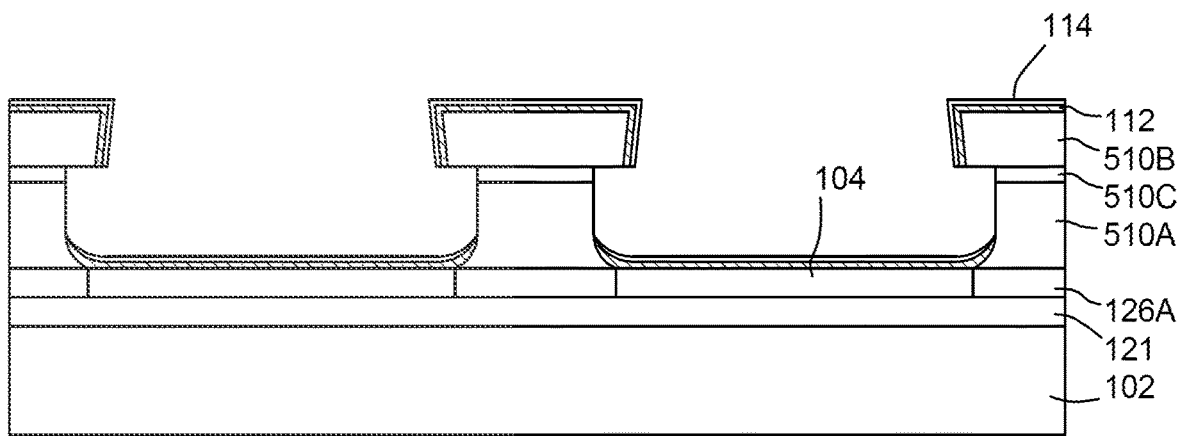
Figure 7M:
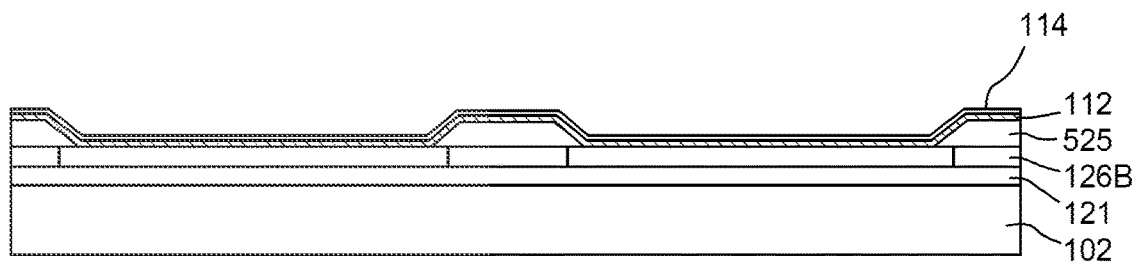

At operation 611, as shown in FIG. 7L (along the pixel plane) and FIG. 7M (along the line plane), the OLED material 112 of the first sub-pixel line 106A and the cathode 114 are deposited. The OLED material 112 includes an HIL material. The shadowing of the adjacent overhangs 509 provides for evaporation deposition of each of the OLED material 112 and the cathode 114. The OLED material 112 and the cathode 114 may separate (e.g., may be non-continuous) along the pixel plane. The OLED material 112 and cathode 114 maintain continuity along the line plane, e.g., the OLED material 112 and the cathode 114 are disposed over the separations structures 525. The total thickness of the OLED material 112 and the cathode 114 is from about 100 nm to about 150 nm.

Figure 7N:
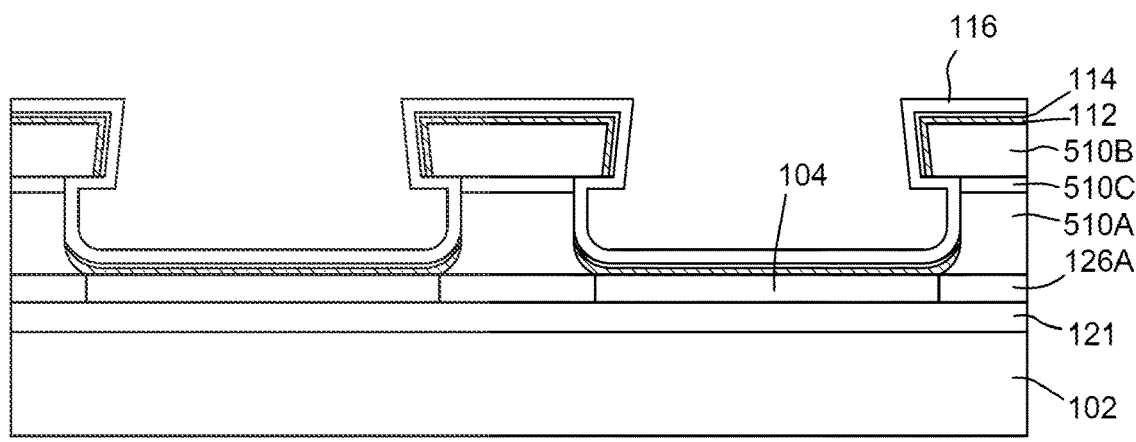

At operation 612, as shown in FIG. 7N (along the pixel plane), the encapsulation layer 116 is deposited. The encapsulation layer 116 is deposited over the cathode 114. A thickness of the encapsulation layer is from about 10 nm to about 50 nm. The shadowing of the adjacent overhangs 509 provides for evaporation deposition of the encapsulation layer 116. The encapsulation layer 116 may maintain continuity along the pixel plane and the line plane.

Figure 7O:
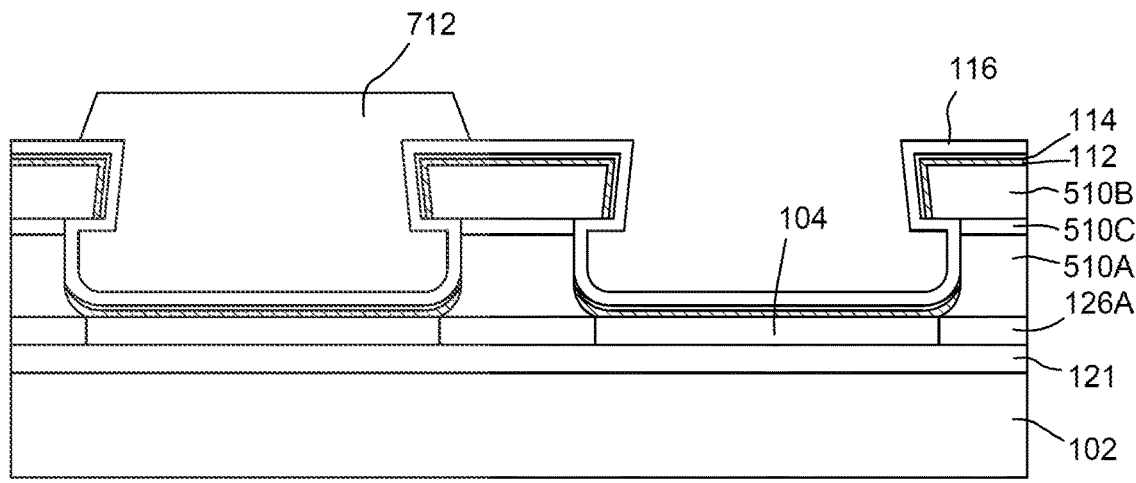
Figure 7P:
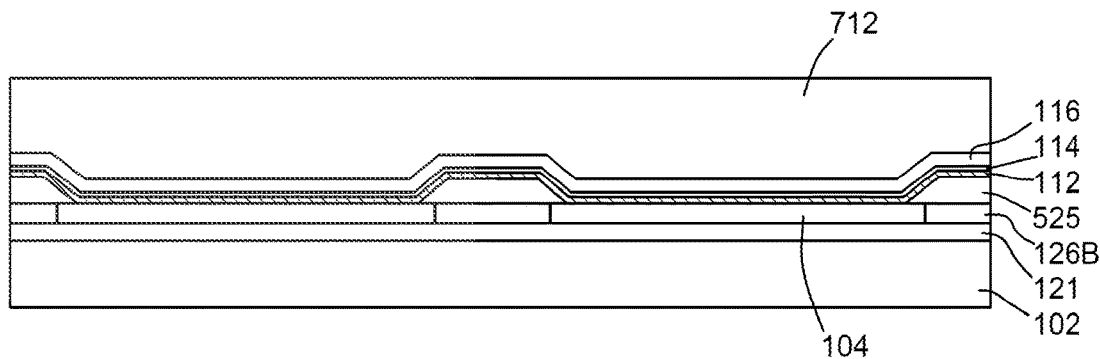

At operation 613, as shown in FIG. 7O (along the pixel plane) and FIG. 7P (along the line plane), a resist 712 is disposed in the first sub-pixel line 106A. The resist 712 is a positive resist or a negative resist. The chemical composition of the resist 712 determine whether the resist 712 is a positive resist or a negative resist. The portion of the first structure layer 710A that has the resist 712 disposed thereon is patterned to protect the first sub-pixel line 106A from the subsequent etching processes. The patterning is one of a photolithography, digital lithography process, or laser ablation process. The resist 712 has a width $W_{12}$ extending over the upper surface 515 of the second structure 510B of less than about 150 nm. The width $W_{12}$ limits the overexposure of the OLED material 112 and cathode 114 disposed under the adjacent overhangs 509.

Figure 7Q:
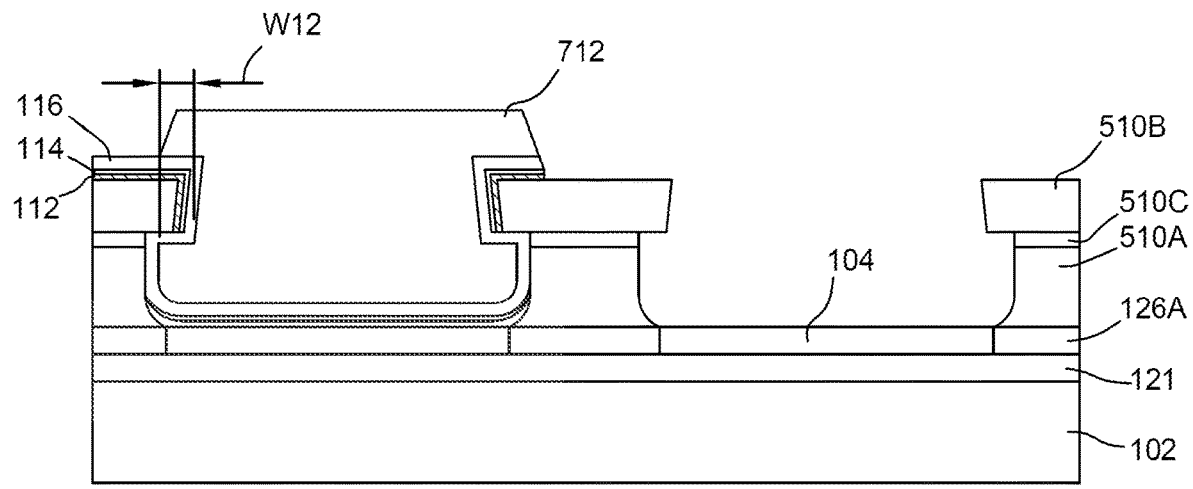
Figure 7R:
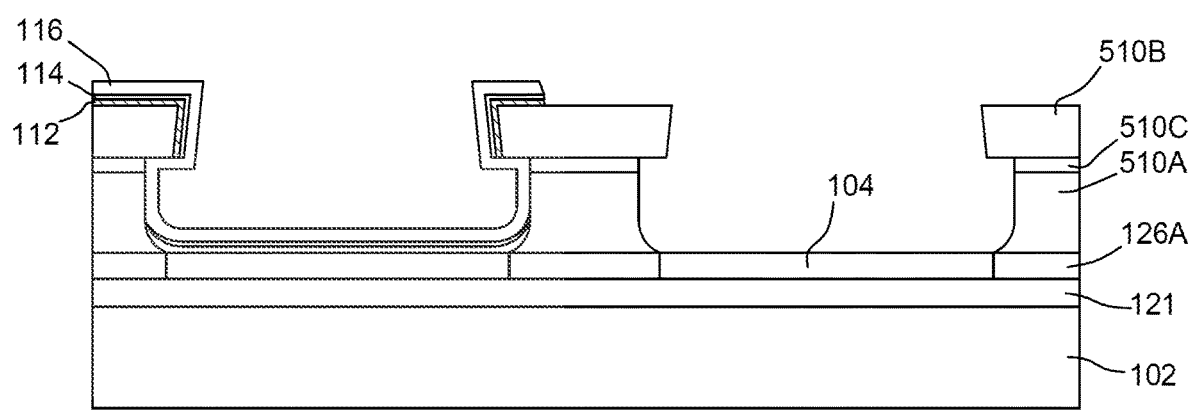

At operation 614, as shown in FIG. 7Q (along the pixel plane), portions of the OLED material 112, the cathode 114, and the encapsulation layer 116 exposed by the resist 712 are removed. The portions of the OLED material 112, the cathode 114, and the encapsulation layer 116 may be removed using ashing (e.g., $O_2$ ashing). The surface of the anode 104 may be cleaned using UV ozone ($O_3$) cleaning.

At operation 615, as shown in FIG. 7R (along the pixel plane), the resist 712 is removed from the first sub-pixel line 106A, leaving behind the first sub-pixel 108A and second sub-pixel 108B of the first sub-pixel line 106A. Operations 611 to 617 may be repeated until the desired number of sub-pixels lines are formed.

Figure 8:
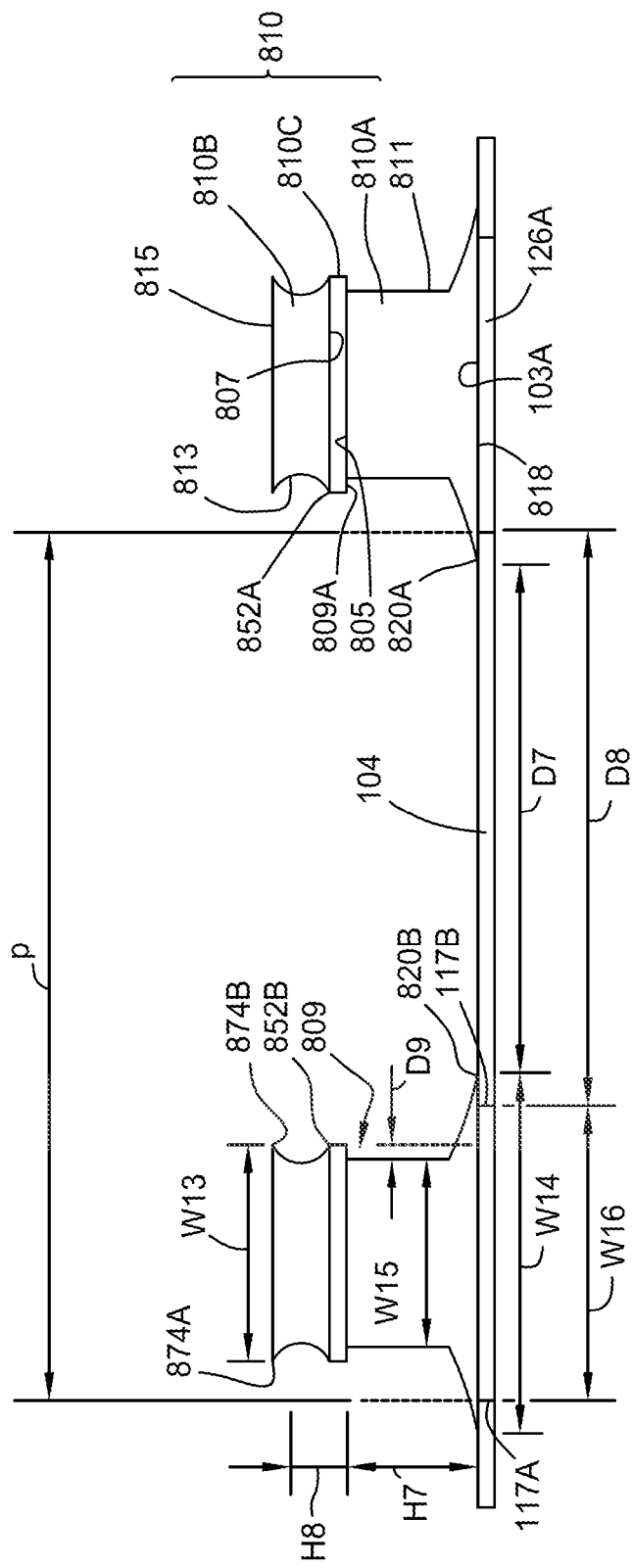
FIG. 8 is a schematic, cross-sectional view of an overhang structure according to embodiments.

FIG. 8 is a schematic, cross-sectional view of an overhang structure 810. The overhang structure 810 may be used in place of the overhang structure 110 in a sub-pixel circuit 100. The overhang structure 810 is shown without the OLED material 112, the cathode 114, the encapsulation layer 116, the base layer 121, or the substrate 102. The overhang structure 810 includes a first structure 810A, a second structure 810B, and an intermediate structure 810C. The first structure 810A is disposed over the first PIS 126A. The intermediate structure 810C is disposed over the first structure 810A. The second structure 810B is disposed over the intermediate structure 810C. In the illustrated embodiment, the intermediate structure 810C is a seed layer that provides a current path through the sub-pixel circuit 100. The intermediate structure 810C includes a titanium (Ti) material.

The second structure 810B has a width W13 from a first underside edge 852A to a second underside edge 852B defining a bottom surface 807 of the second structure. In some embodiments, the width W13 may also define an upper surface 815 of the second structure 810B from a first edge 874A to a second upperside edge 874B. The width W13 is from about 0.4 μm to about 1.2 μm. A first structure 810A has a width W14 from the first endpoint 820A of the bottom surface 818 to the second endpoint 820B of the bottom surface 818. The width W14 is from about 0.6 μm to about 1.4 μm. The upper surface 805 of the first structure 810A has a width W15. The width W15 is from 0.2 μm to about 0.8 μm. The first PIS 126A has a width W16 from the first edge 117A to the second edge 117B. The width W16 is from 0.4 μm to about 1.2 μm.

The overhang structures 810 have a height H7 from the upper surface 103A of the first PIS 126A to the bottom surface 807 of the second structure 810B. The height H7 is from about 0.1 μm to about 0.5 μm. The height H7 may be the height of the first structure 810A or the height of the first structure 810A and an intermediate structure 810C. The second structure 810B has a height H8 from the bottom surface 807 to the upper surface 815. The height H8 is from about 0.15 μm to about 0.25 μm. A width of the upper surface 815 of the second structure 810B may be equal to or approximately equal to the width of the bottom surface 807 of the second structure 810B.

The sub-pixel circuit 100 has a pitch p. The pitch p is the distance from a first edge 817A of the first PIS 126A to the first edge 117A of an adjacent first PIS 126A. The pitch p is from about 2 μm to about 8 μm. The sub-pixel circuit 100 has a distance D7 from the second underside edge 852B of the first structure 810A of an overhang structure 810 to a first underside edge 852A of the first structure 810A of an adjacent overhang structure 810. The distance D7 is from about 2 μm to about 6 μm. The sub-pixel circuit 100 has a distance D8 from the second edge 117B of the first PIS 126A to the first edge 117A of an adjacent first PIS 126A (e.g., a width of the anode 104). The distance D8 is from 2 μm to about 6 μm. The distance D7 and the distance D8 may be equal or approximately equal. The overhang structure 810 has a distance D9 from a first underside edge 852A or a second underside edge 852B of the second structure 810B to the sidewall 811 of the first structure 810A. The distance D9 is less than about 0.15 μm.

Figure 9:
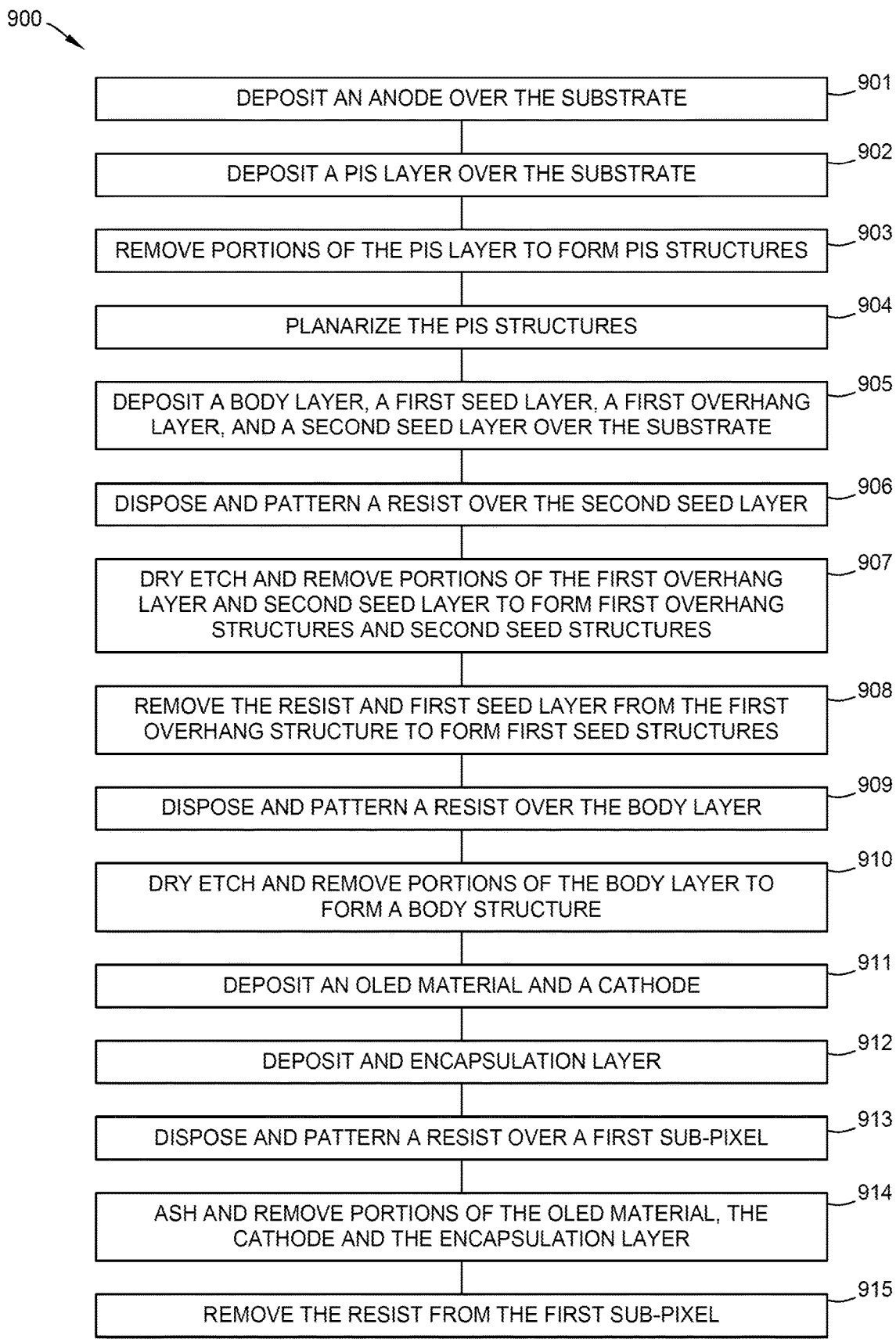
FIG. 9 is a flow diagram of a method for forming a sub-pixel according to according to embodiments.
Figure 10A:
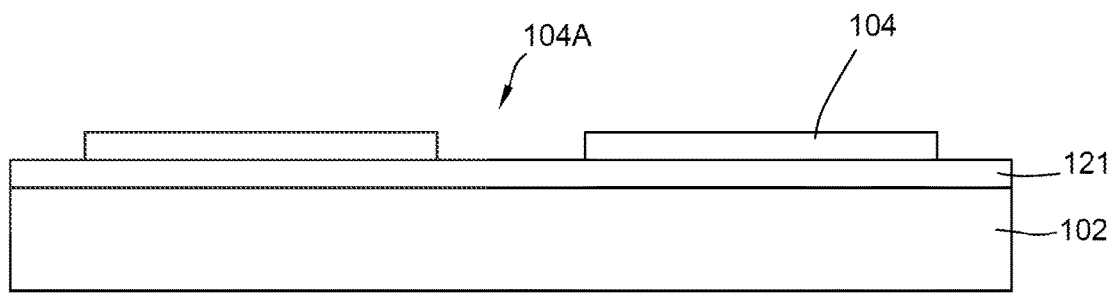
FIG. 10A-10R are schematic, cross-sectional views of a substrate during a method of forming a sub-pixel according to embodiments.

FIG. 9 is a flow diagram of a method 900 for forming a sub-pixel circuit 100 according to embodiment. FIG. 10A-10R are schematic, cross-sectional views of a substrate 102 during a method 900 for forming a sub-pixel circuit 100 according to embodiments described herein.

At operation 901, as shown in FIG. 10A (along the pixel plane), an anode 104 is deposited over the substrate 102. The anode 104 may be deposited on the substrate 102. In another embodiment, the anode 104 is deposited on a base layer 121. The base layer 121 is disposed on the substrate 102. The anode 104 may be deposited using metal-organic decomposition (MOD). An anode gap 104A separates the anode 104 from an adjacent anode 104.

Figure 10B:
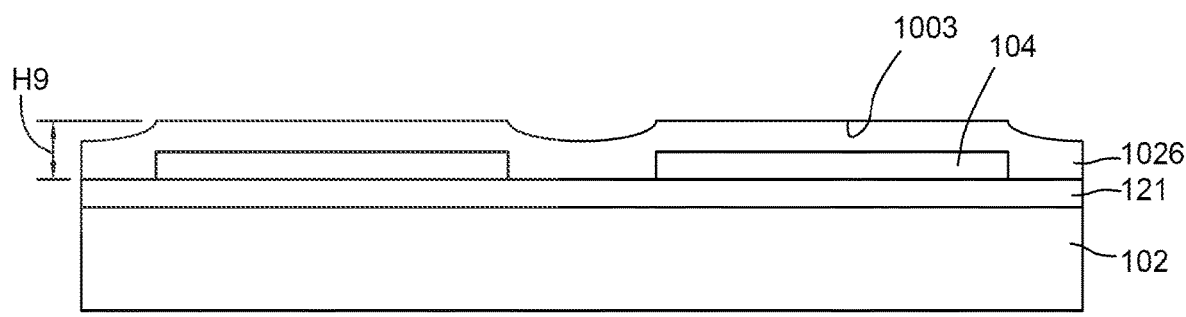

At operation 902, as shown in FIG. 10B (along the pixel plane), a PIS layer 1026 is deposited over the substrate 102. The PIS layer 1026 may be deposited on the anode 104 and on the base layer 121 in the anode gap 104A. A height H9 from the base layer 121 to an upper surface 1003 of the PIS layer 1026 is from about 400 nm to about 700 nm.

Figure 10C:
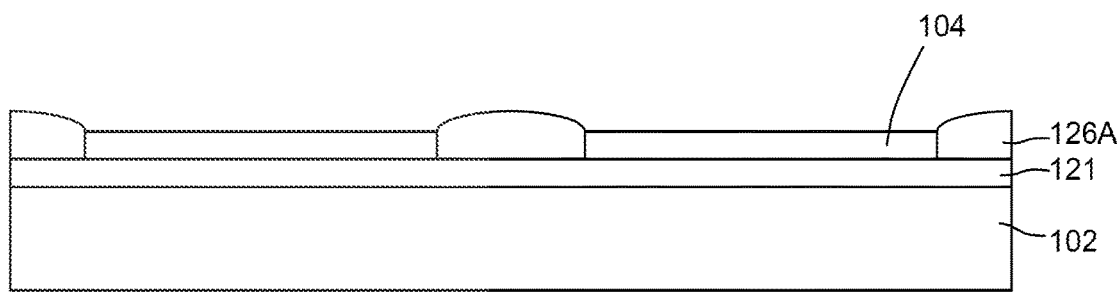
Figure 10D:
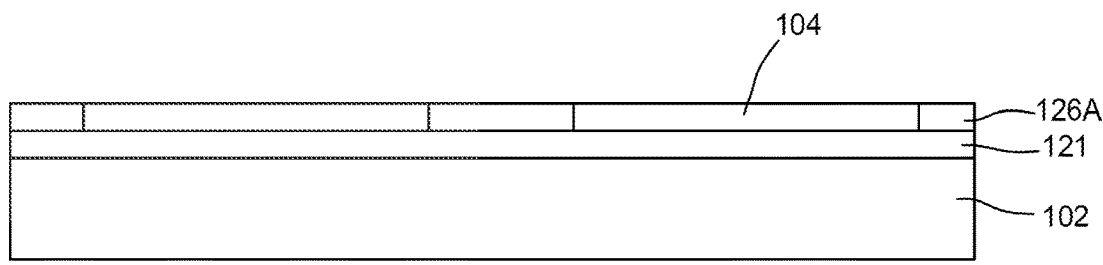

At operation 903, as shown in FIG. 10C (along the pixel plane), portions of the PIS layer 1026 are removed. The PIS layer 1026 may be removed by a wet etch or dry etch process. Operation 903 exposes the anode 104 and forms first PIS 126A and second PIS 126B. At operation 904, as shown in FIG. 10D (along the pixel plane), the first PIS 126A and second PIS 126B are planarized. The upper surface 103A of the first PIS 126A and the upper surface 103B of the second PIS 126B are aligned with the upper surface of the anode 104. The first PIS 126A and second PIS 126B are cured at a temperature of about 140° C. to about 180° C. for about 10 minutes to about 20 minutes. The curing of the first PIS 126A and second PIS 126B enables shrinkage of the plurality of first PIS 126A and second PIS 126B. The first PIS 126A and second PIS 126B are planarized after curing. The planarization process of the plurality of first PIS 126A and second PIS 126B may be performed using chemical-mechanical planarization (CMP).

Figure 10E:
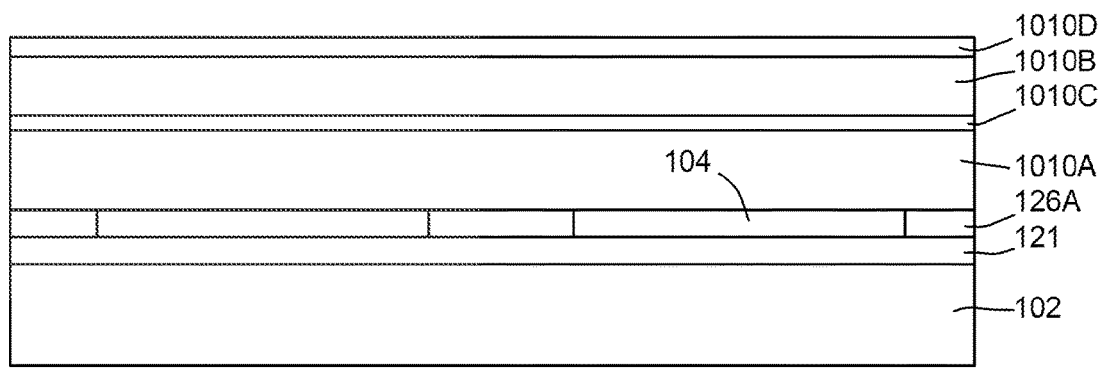

At operation 905, as shown in FIG. 10E (along the pixel plane), a first structure layer 1010A, a first intermediate layer 1010C, a second structure layer 1010B, and a second intermediate layer 1010D are deposited over the substrate 102. The first structure layer 1010A is deposited on the anode 104 and the first PIS 126A and second PIS 126B. The first structure layer 1010A has a thickness $t_9$ from about 0.1 μm to about 0.5 μm. The first intermediate layer 1010C is deposited on the first structure layer 1010A. The first intermediate layer 1010C has a thickness $t_{10}$ less than about 50 nm. The second structure layer 1010B is deposited on the first intermediate layer 1010C. The second structure layer 1010B is deposited using sputtering deposition. The second structure layer 1010B has a thickness $t_{11}$ from about 0.15 μm to about 0.25 μm. The second intermediate layer 1010D is deposited on the second structure layer 1010B. The second intermediate layer 1010D has a thickness $t_{12}$ from about 50 nm to about 150 nm. The second intermediate layer 1010D includes a titanium (Ti) material.

Figure 10F:
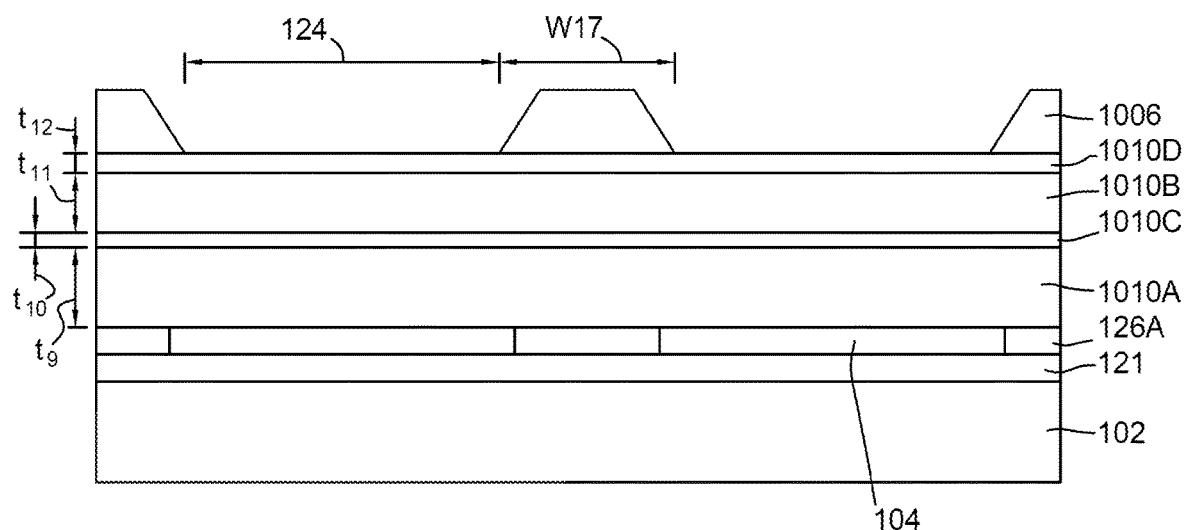

At operation 906, as shown in FIG. 10F (along the pixel plane), a resist 1006 is disposed and patterned. The resist 1006 is disposed over second intermediate layer 1010D. The resist 1006 may have a width W17 of about 0.8 µm to about 1.2 µm. The resist is a positive resist or a negative resist. A positive resist includes portions of the resist, which, when exposed to electromagnetic radiation, are respectively soluble to a resist developer applied to the resist after the pattern is written into the resist using the electromagnetic radiation. A negative resist includes portions of the resist, which, when exposed to radiation, will be respectively insoluble to the resist developer applied to the resist after the pattern is written into the resist using the electromagnetic radiation. The chemical composition of the resist 1006 determines whether the resist is a positive resist or a negative resist. The portion of the second structure layer 10108 that has the resist 1006 disposed thereon is patterned to form a pixel opening 124 of the line-type architecture 101C of the first sub-pixel line 106A. The patterning is one of a photolithography, digital lithography process, or laser ablation process.

Figure 10G:
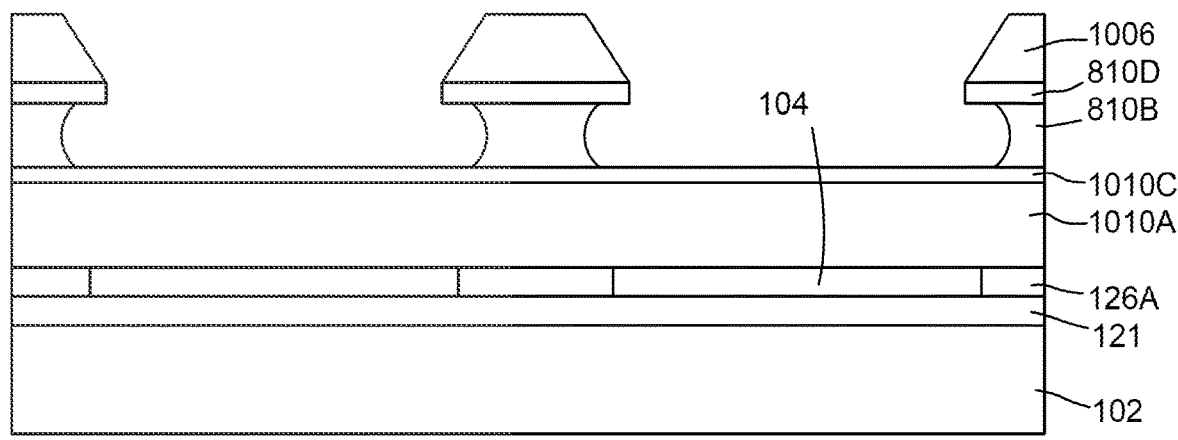
Figure 10H:
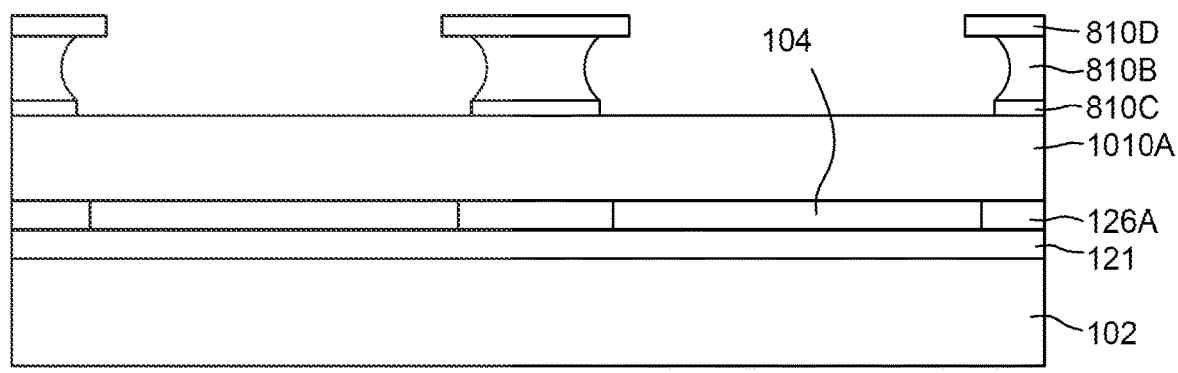

At operation 907, as shown in FIG. 10G (along the pixel plane), portions of the second structure layer 10108 and second intermediate layer 1010D exposed by the pixel opening 124 are removed. The second structure layer 10108 and the second intermediate layer 1010D are removed by dry etching. Operations 907 forms the second structure 810B and the second intermediate structure 810D. At operation 908, as shown in FIG. 10H (along the pixel plane), the resist 1006 and the first intermediate layer 1010C are removed from the second structure 110B. Operation 908 forms the intermediate structures 810C.

Figure 10I:
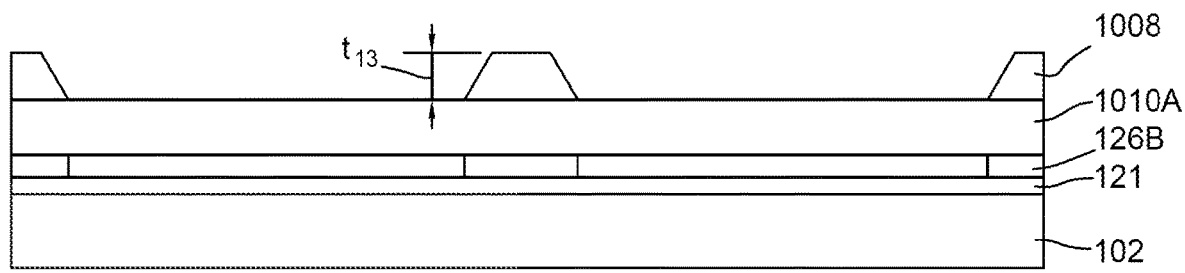

At operation 909, as shown in FIG. 10I (along the line plane), a resist 408 is disposed and patterned. The resist 1008 is disposed over the first structure layer 1010A. The resist 1008 has a thickness $t_{13}$ less than about 500 nm. The resist 1008 has a taper from a bottom surface to an upper surface of about 40° to 50°, where the bottom surface of the resist 1008 has a width that is greater than the upper surface of the resist 1008. The resist 1008 is a positive resist or a negative resist. The chemical composition of the resist 1008 determine whether the resist 1008 is a positive resist or a negative resist. The portion of the first structure layer 1010A that has the resist 1008 disposed thereon is patterned to form a pixel opening 124 of the line-type architecture 101C of the first sub-pixel line 106A. The patterning is one of a photolithography, digital lithography process, or laser ablation process.

Figure 10J:
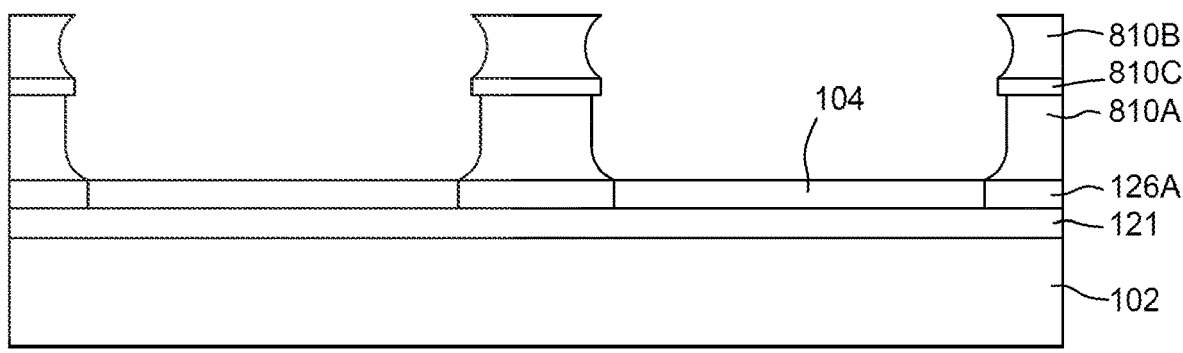
Figure 10K:
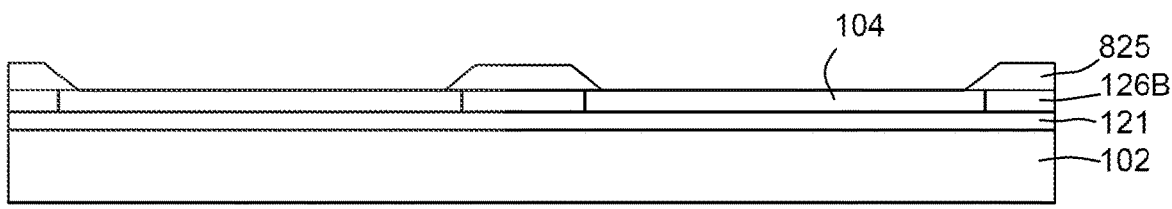

At operation 910, as shown in FIG. 10J (along the pixel plane) and FIG. 10K (along the line plane), portions of the first structure layer 1010A exposed by the pixel opening 124 and the resist 1008 are removed. The first structure layer 1010A and resist 1008 are removed using dry etching. Operation 910 forms the first structure 810A and separation structures 825. The etch selectivity between the materials of the second structure layer 10108 corresponding to the second structure 810B, the first structure layer 1010A corresponding to the first structure 810A, and the etch processes to remove the exposed portions of the second structure layer 1010B and the first structure layer 1010A provide for the bottom surface 807 of the second structure 810B being wider than the upper surface 805 of the first structure 810A to form an overhang extension 809A of the adjacent overhangs 809. The shadowing of the adjacent overhangs 809 provide for evaporation deposition of the OLED material 112 and the cathode 114.

Figure 10L:
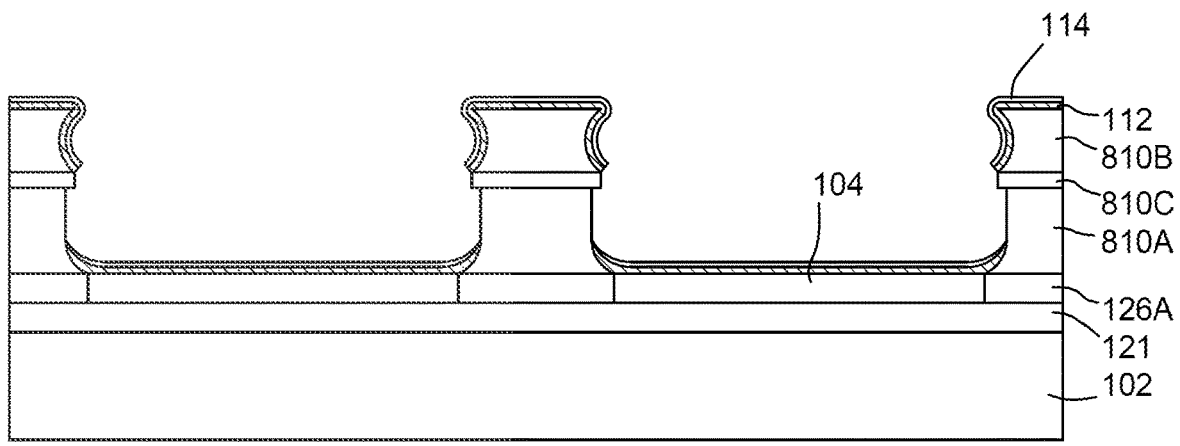
Figure 10M:
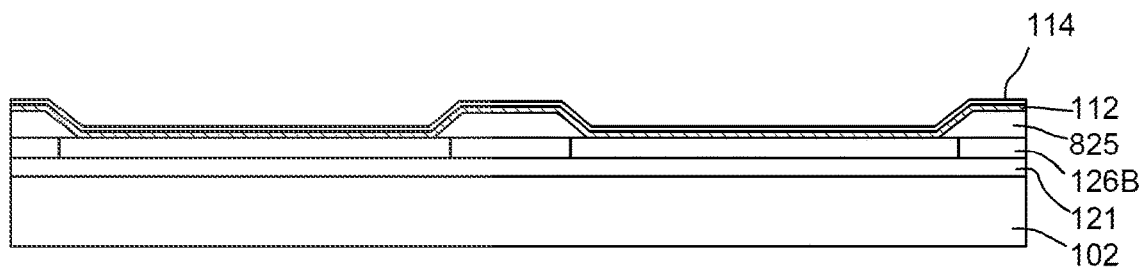

At operation 911, as shown in FIG. 10L (along the pixel plane) and FIG. 10M (along the line plane), the OLED material 112 of the first sub-pixel line 106A and the cathode 114 are deposited. The OLED material 112 includes an HIL material. The shadowing of the adjacent overhangs 109 provides for evaporation deposition of each of the OLED material 112 and the cathode 114. The OLED material 112 and the cathode 114 may separate (e.g., may be non-continuous) along the pixel plane. The OLED material 112 and cathode 114 maintain continuity along the line plane, e.g., the OLED material 112 and the cathode 114 are disposed over the separations structures 825. The total thickness of the OLED material 112 and the cathode 114 is from about 100 nm to about 150 nm.

Figure 10N:
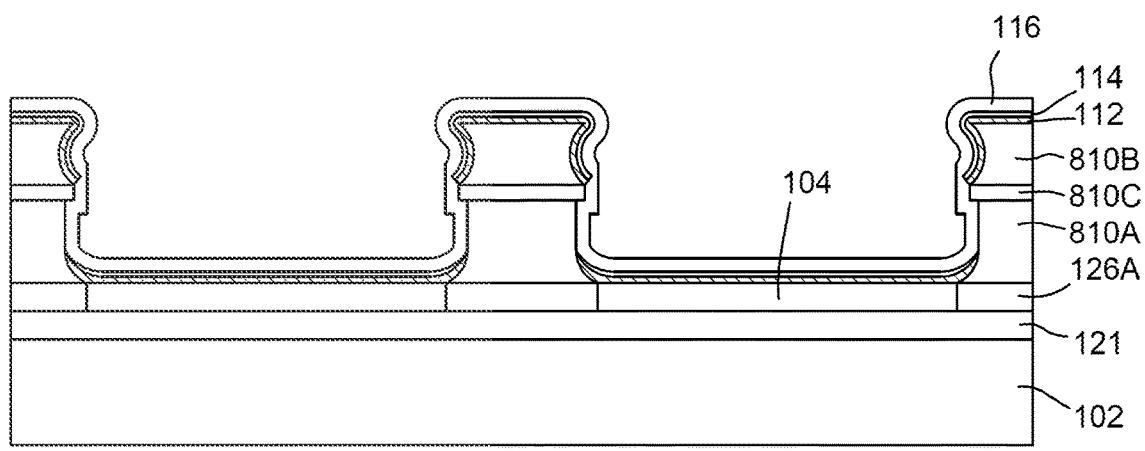

At operation 912, as shown in FIG. 10N (along the pixel plane), the encapsulation layer 116 is deposited. The encapsulation layer 116 is deposited over the cathode 114. A thickness of the encapsulation layer is from about 10 nm to about 50 nm. The shadowing of the adjacent overhangs 809 provides for evaporation deposition of the encapsulation layer 116. The encapsulation layer 116 may maintain continuity along the pixel plane and the line plane.

Figure 10O:
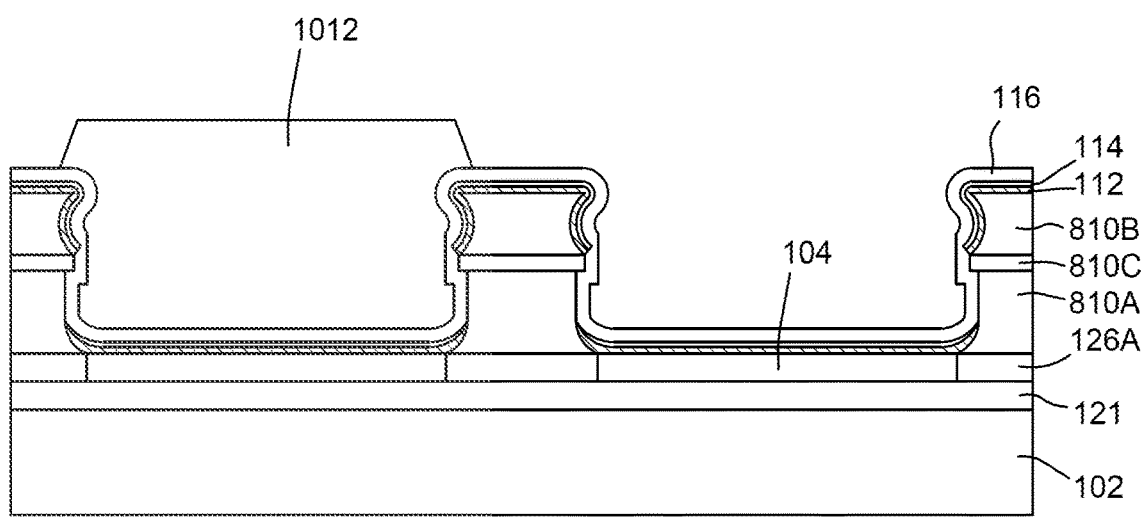
Figure 10P:
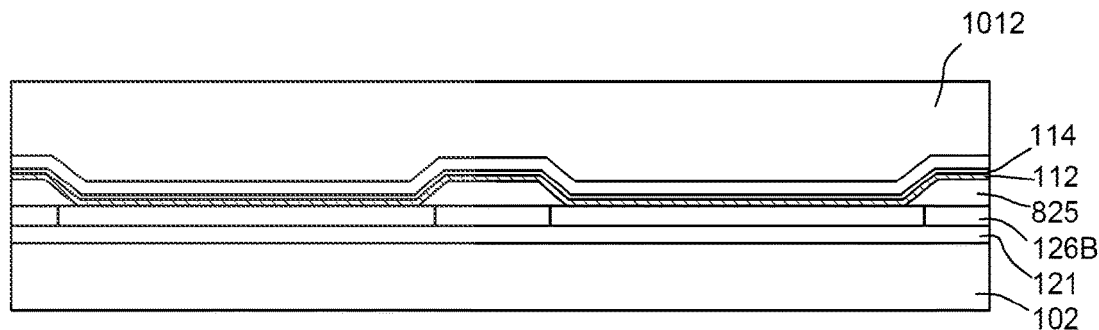

At operation 913, as shown in FIG. 10O (along the pixel plane) and FIG. 10P (along the line plane), a resist 1012 is disposed in the first sub-pixel line 106A. The resist 1012 is a positive resist or a negative resist. The chemical composition of the resist 1012 determine whether the resist 1012 is a positive resist or a negative resist. The resist 1012 is patterned to protect the first sub-pixel line 106A from the subsequent etching processes. The patterning is one of a photolithography, digital lithography process, or laser ablation process. The resist 1012 has a width W18 extending over the upper surface 815 of the second structure 810B. The width W18 is less than about 150 nm. The width W18 limits the overexposure of the OLED material 112 and cathode 114 disposed under the adjacent overhangs 809.

Figure 10Q:
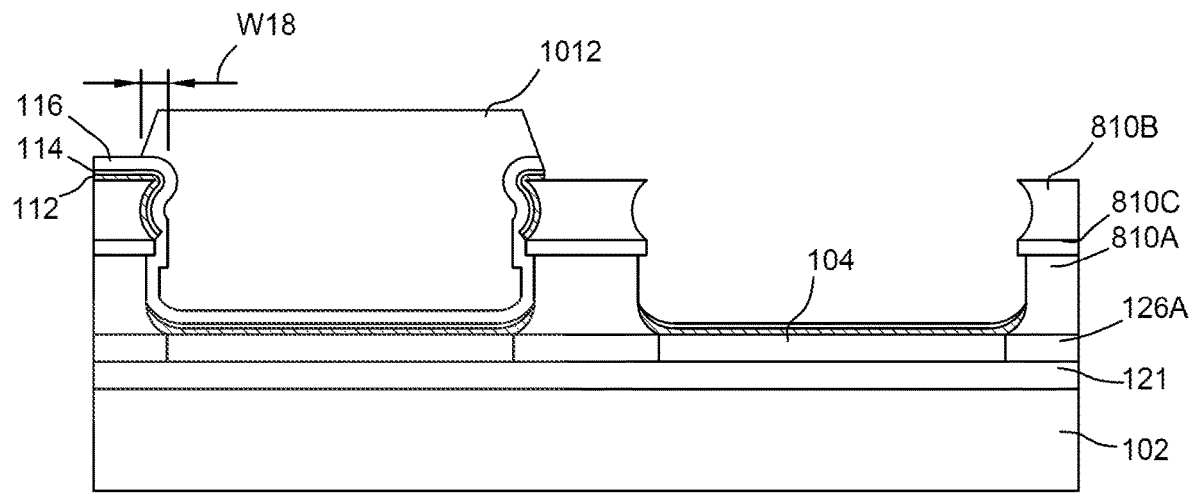
Figure 10R:
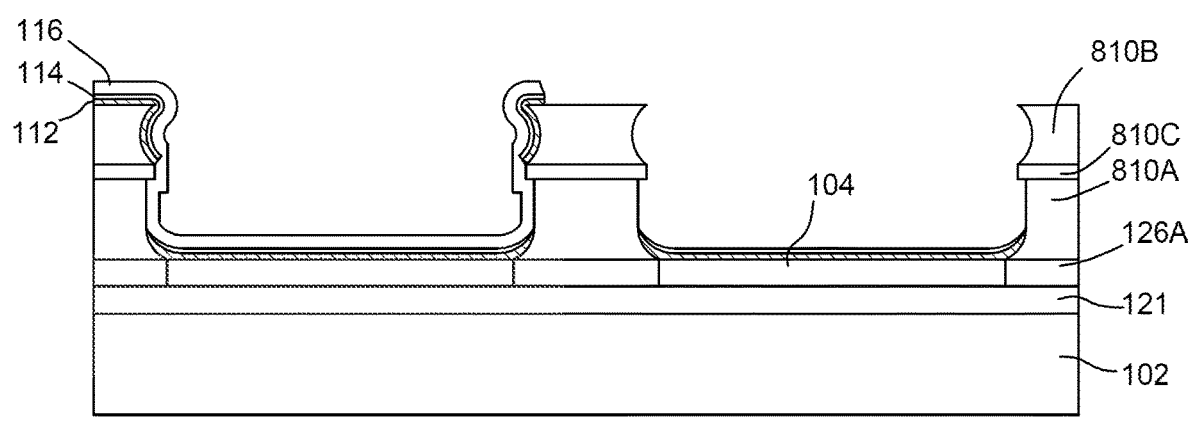

At operation 914, as shown in FIG. 10Q (along the pixel plane), portions of the OLED material 112, the cathode 114, and the encapsulation layer 116 exposed by the resist 1012 are removed. The portions of the OLED material 112, the cathode 114, and the encapsulation layer 116 may be removed using ashing (e.g., $O_2$ ashing). The surface of the anode 104 may be cleaned using UV ozone ($O_3$) cleaning.

At operation 915, as shown in FIG. 10R (along the pixel plane), the resist 1012 is removed from the first sub-pixel line 106A, leaving behind the first sub-pixel 108A and second sub-pixel 1088 of the first sub-pixel line 106A. Operations 911 to 917 may be repeated until the desired number of sub-pixels lines are formed.

In summation, a device is disclosed. The device includes a plurality of sub-pixel lines. Each sub-pixel line includes at least a first sub-pixel and a second sub-pixel. The first sub-pixel and the second sub-pixel each include an anode, overhang structures, separation structures, an organic light emitting diode (OLED) material, and a cathode. The anode is defined by adjacent first pixel isolation structures (PIS) and adjacent second PIS. The overhang structures are disposed on the first PIS. The overhang structures include a second structure disposed over the first structure and an intermediate structure disposed between the second structure and the first structure. A bottom surface of the second structure extends laterally past an upper surface of the first structure. The first structure is disposed over the first PIS. The separation structures are disposed over the second PIS. One of the separation structures separates the first pixel and the second pixel. The OLED material is disposed over the anode and an upper surface of the separation structures. The OLED material of the first subpixel and the second subpixel emit a first color. The cathode is disposed over the OLED material and an upper surface of the separation structures.

What is claimed is:

1. A device, comprising:
   overhang structures disposed along a line plane, the overhang structures comprising a conductive material;
   separation structures disposed along a pixel plane;
   an organic light emitting diode (OLED) material disposed over a top surface of the overhang structures, between adjacent overhang structures, and over the separation structures;
   a cathode disposed over the OLED material over the top surface of the overhang structures, between the adjacent overhang structures, and over the separation structures;
   an encapsulation layer at least disposed over the cathode over the top surface of the overhang structures, along a sidewall of the overhang structures, and between the adjacent overhang structures, wherein the encapsulation layer separates the OLED material and the cathode over the top surface of the overhang structures from the OLED material and the cathode between the adjacent overhang structures, wherein the OLED material and the cathode are disposed along a portion of the sidewall of the overhang structures and are separated from the OLED material and the cathode over the top surface of the overhang structures by the encapsulation layer.

2. The device of claim 1, wherein the conductive material includes is a metal-containing material.

3. The device of claim 2, wherein the conductive material includes copper (Cu), aluminum (Al), aluminum neodymium (AlNd), molybdenum (Mo), molybdenum tungsten (MoW), or combinations thereof.

4. The device of claim 1, wherein the OLED material is continuous over the separation structures over the line plane.

5. The device of claim 1, wherein the cathode is continuous over the separation structures over the line plane.

6. The device of claim 1, wherein the separation structures have a height less than the overhang structures.

7. The device of claim 1, wherein the encapsulation layer contacts a portion of the sidewall of the overhang structures.

8. The device of claim 1, wherein an opening between upper portions of the adjacent overhang structures is greater the opening between lower portions of the adjacent overhang structures.

9. A device, comprising:
   overhang structures disposed along a line plane, the overhang structures comprising a conductive material;
   separation structures disposed along a pixel plane;
   an organic light emitting diode (OLED) material, the OLED material having:
      a first portion disposed over a top surface of the overhang structures;
      a second portion disposed between adjacent overhang structures; and
      a third portion disposed over the separation structures;
   a cathode, the cathode having:
      a fourth portion disposed over the first portion of the OLED material;
      a fifth portion disposed over the second portion of the OLED material; and
      a sixth portion disposed over the third portion of the OLED material;
   an encapsulation layer disposed:
      over the cathode over the top surface of the overhang structures;
      along a sidewall of the overhang structures, wherein the encapsulation layer along the sidewall separates the first portion of the OLED material and the third portion of the cathode from the second portion of the OLED material and the fourth portion of the cathode; and
      between the adjacent overhang structures, wherein the OLED material and the cathode are disposed along a portion of the sidewall of the overhang structures and are separated from the OLED material and the cathode over the top surface of the overhang structures by the encapsulation layer.

10. The device of claim 9, wherein the conductive material includes is a metal-containing material.

11. The device of claim 10, wherein the conductive material includes copper (Cu), aluminum (Al), aluminum neodymium (AlNd), molybdenum (Mo), molybdenum tungsten (MoW), or combinations thereof.

12. The device of claim 9, wherein the OLED material is continuous over the separation structures over the line plane.

13. The device of claim 9, wherein the cathode is continuous over the separation structures over the line plane.

14. The device of claim 9, wherein the separation structures have a height less than the overhang structures.

15. The device of claim 9, wherein the encapsulation layer contacts a portion of the sidewall of the overhang structures.

16. The device of claim 9, wherein an opening between upper portions of the adjacent overhang structures is greater the opening between lower portions of the adjacent overhang structures.

17. A device, comprising:
   overhang structures disposed along a line plane, the overhang structures comprising a conductive material;
   separation structures disposed along a pixel plane;
   an organic light emitting diode (OLED) material disposed on a top surface of the overhang structures, between adjacent overhang structures, and on the separation structures;
   a cathode disposed on the OLED material over the top surface of the overhang structures, between the adjacent overhang structures, and on the separation structures;
   an encapsulation layer at least disposed on the cathode over the top surface of the overhang structures, along a sidewall of the overhang structures, and between the adjacent overhang structures, wherein the encapsulation layer separates the OLED material and the cathode over the top surface of the overhang structures from the OLED material and the cathode between the adjacent overhang structures, and wherein the OLED material and the cathode are disposed along a portion of the sidewall of the overhang structures and are separated from the OLED material and the cathode over the top surface of the overhang structures by the encapsulation layer.

18. The device of claim 17, wherein the conductive material includes copper (Cu), aluminum (Al), aluminum neodymium (AlNd), molybdenum (Mo), molybdenum tungsten (MoW), or combinations thereof.

* * * * *